US010766169B2

(12) United States Patent
Matsumoto et al.

(10) Patent No.: US 10,766,169 B2
(45) Date of Patent: Sep. 8, 2020

(54) RESIN MOLD

(71) Applicant: ASAHI KASEI E-MATERIALS CORPORATION, Tokyo (JP)

(72) Inventors: Shinji Matsumoto, Tokyo (JP); Jun Koike, Tokyo (JP)

(73) Assignee: ASAHI KASEI E-MATERIALS CORPORATION, Tokyo (JP)

( * ) Notice: Subject to any disclaimer, the term of this patent is extended or adjusted under 35 U.S.C. 154(b) by 96 days.

(21) Appl. No.: 15/925,342

(22) Filed: Mar. 19, 2018

(65) Prior Publication Data

US 2018/0207841 A1 Jul. 26, 2018

Related U.S. Application Data

(62) Division of application No. 13/583,171, filed as application No. PCT/JP2011/055505 on Mar. 9, 2011, now abandoned.

(30) Foreign Application Priority Data

Mar. 10, 2010 (JP) ................... 2010-053194

(51) Int. Cl.
*B29C 33/58* (2006.01)
*B82Y 10/00* (2011.01)
(Continued)

(52) U.S. Cl.
CPC ............. *B29C 33/58* (2013.01); *B82Y 10/00* (2013.01); *B82Y 40/00* (2013.01); *G03F 7/0002* (2013.01)

(58) Field of Classification Search
CPC ............. B29C 33/58; B29C 2033/385; B29C 33/3807; G03F 7/0002; B82Y 40/00; B82Y 10/00; H01L 21/0274
See application file for complete search history.

(56) References Cited

U.S. PATENT DOCUMENTS 5,907,017 A * 5/1999 Ober .................. C07C 53/50
525/332.3
6,906,115 B2 6/2005 Hanazawa et al.
(Continued)

FOREIGN PATENT DOCUMENTS

JP 2005-47080 A 2/2005
JP 2006-116896 A 5/2006
(Continued)

OTHER PUBLICATIONS

Li, Kun, Pingping Wu, and Zhewen Han. "Preparation and surface properties of fluorine-containing diblock copolymers." Polymer 43.14 (2002): 4079-4086. (Year: 2002).*
(Continued)

*Primary Examiner* — Leith S Shafi
(74) *Attorney, Agent, or Firm* — Birch, Stewart, Kolasch & Birch, LLP

(57) ABSTRACT

To provide a resin mold which is excellent in adhesion to a substrate, excellent in release properties from a transfer material resin, further excellent in durability of the resin mold itself, and which endures repetition transfer to the transfer material resin, a resin mold of the invention is a resin mold having a fine concavo-convex structure on the surface, and is characterized in that the fluorine element concentration (Es) in a resin mold surface portion is the average fluorine element concentration (Eb) in the resin forming the resin mold or more.

18 Claims, 1 Drawing Sheet

(51) Int. Cl.
  *B82Y 40/00*  (2011.01)
  *G03F 7/00*  (2006.01)

(56) References Cited

U.S. PATENT DOCUMENTS

| | | |
|---|---|---|
| 8,258,201 B2 | 9/2012 | Kawaguchi |
| 8,846,186 B2 | 9/2014 | Takeguchi et al. |
| 2002/0084553 A1 | 7/2002 | Nun et al. |
| 2005/0023433 A1 | 2/2005 | Ishitaka et al. |
| 2010/0089096 A1 | 4/2010 | Tamitsuji et al. |
| 2010/0160478 A1* | 6/2010 | Nilsson .......... B82Y 10/00 522/170 |
| 2011/0020617 A1 | 1/2011 | Kawaguchi |
| 2011/0183127 A1 | 7/2011 | Kodama |
| 2011/0184126 A1* | 7/2011 | Takemura .......... C08J 3/24 525/198 |

FOREIGN PATENT DOCUMENTS

| | | |
|---|---|---|
| JP | 2006-198883 A | 8/2006 |
| JP | 2009-45925 A | 3/2009 |
| WO | 2009/145061 A1 | 12/2009 |

OTHER PUBLICATIONS

Montefusco, F., et al. "Original vinylidene fluoride-containing acrylic monomers as surface modifiers in photopolymerized coatings." Macromolecules 37.26 (2004): 9804-9813. (Year: 2004).*
Vitale, Alessandra, Roberta Bongiovanni, and Bruno Ameduri. "Fluorinated oligomers and polymers in photopolynnerization." Chemical reviews 115.16 (2015): 8835-8866. (Year: 2015).*
Ming, Weihua, et al. "Low surface energy polymeric films from partially fluorinated photocurable solventless liquid oligoesters." Polymer Bulletin 47.3-4 (2001): 321-328. (Year: 2001).*
International Search Report for PCT/JP2011/055505 dated Apr. 12, 2011.

* cited by examiner

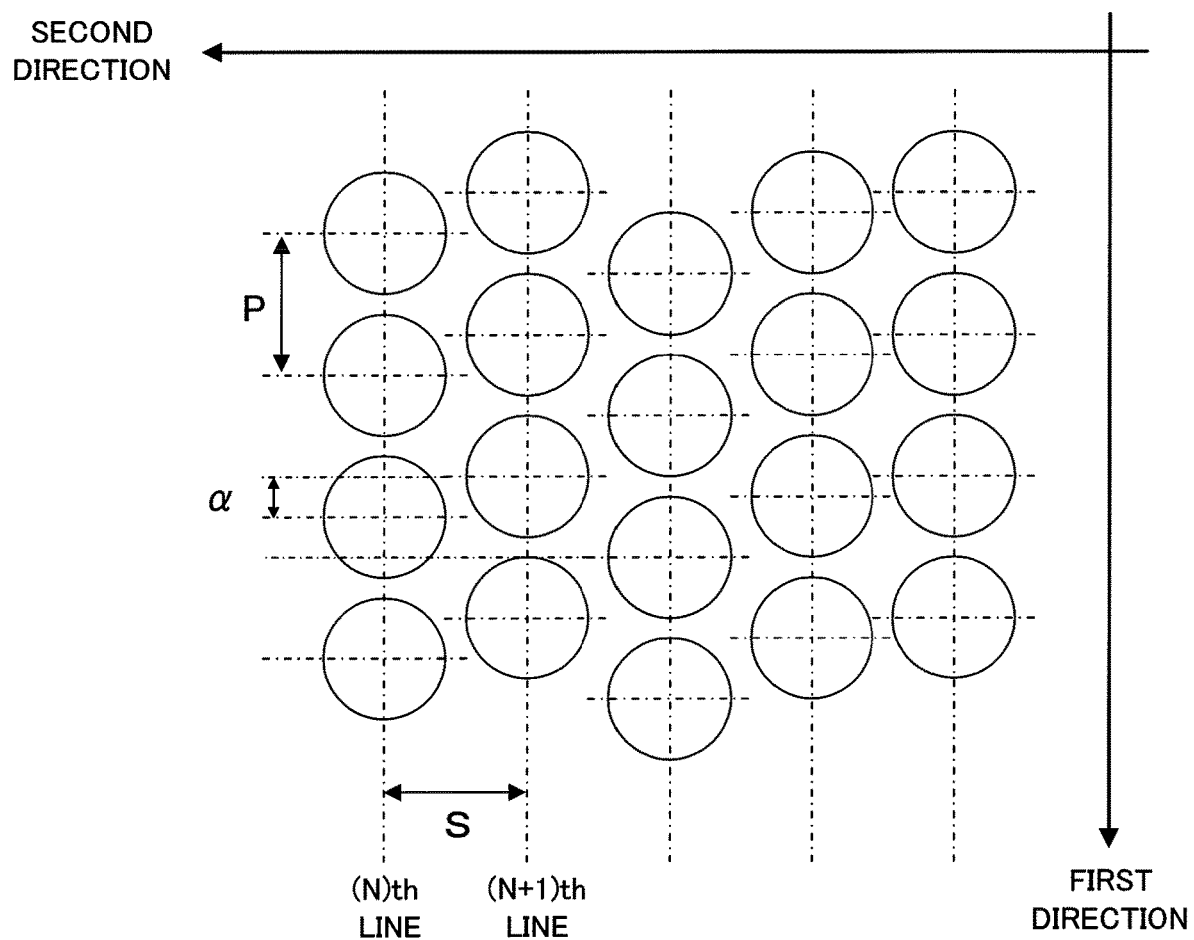

RESIN MOLD

CROSS-REFERENCE TO RELATED APPLICATIONS

This application is a Divisional of co-pending application Ser. No. 13/583,171 filed on Oct. 31, 2012, which is a National Phase of PCT International Application No. PCT/JP2011/055505 filed on Mar. 9, 2011, which claims priority under 35 U.S.C. § 119(a) to Patent Application No. 2010-053194 filed in Japan on Mar. 10, 2010. All of the above applications are hereby expressly incorporated by reference into the present application.

TECHNICAL FIELD

The present invention relates to a resin mold for transfer, and more particularly, to a resin mold containing fluorine.

BACKGROUND ART

To develop optical elements and biological materials having control targets in nano/micrometer size regions, it significantly affects the control function using members of which the processing is precisely controlled in the nano/micrometer size regions. Particularly, in the case of consumer-optical elements, since wavelength control is required mainly in regions of hundreds of nanometers, the processing accuracy of several nanometers to tens of nanometers is important. Further, from the viewpoint of mass productivity, desired are precision processing techniques also provided with the reproducibility of the processing accuracy, uniformity, and throughput properties.

As well-known fine processing techniques, for example, there are a method of directly performing fine processing using electron beams, a method of collectively rendering in a large area by interference exposure, etc. Recently, the fine pattern processing using the step and repeat method has been known by applying a stepper apparatus of semiconductor techniques. However, either of techniques requires a plurality of processing steps, further requires high capital investment, and is not considered a technique with good productivity in manufacturing time and cost.

As one processing method proposed to solve the problems, there is the nanoimprint method. The method is of a technique for using a fine pattern-processed member as a mold, and easily transferring to a resin (transfer material) with a processing accuracy of several nanometers to tens of nanometers to duplicate. The method is executed inexpensively with simplified steps, and therefore, receives attention as the precision duplication processing technique that is industrially indispensable. From differences in the physical properties of the transfer material and processing process, the technique is classified into thermal nanoimprint, photo nanoimprint, room-temperature nanoimprint, softlithography and the like. Among the methods, the photo nanoimprint method using a photo-curing resin is easy to apply to roll-to-roll method process for enabling transfer to be repeated promptly, and is attractive in throughput properties. Due to the process, exposure is essential from the transfer material side or mold side, and it is therefore necessary to select materials having high light transmittance in the UV-visible region. Particularly, for materials on the mold side, the materials are principally limited to quartz, sapphire, and glass molds, and since the materials are rigid materials, there is the problem of lacking in versatility in continuous manufacturing technique and processing process. To solve the problems that such rigid molds have, resin molds having transparency and flexibility are required as a substitute for rigid molds. In recent years, resin molds provided with transparency and flexibility have been reported (Patent Literature 1), but there is no disclosure on adhesion to a substrate in thermoplastic resin molds disclosed in Patent Literature 1.

CITATION LIST

Patent Literature

[Patent Literature 1]
Japanese Unexamined Patent Publication NO. 2006-198883

DISCLOSURE OF INVENTION

Technical Problem

Further, by subsequent studies of the inventors of the invention, in a resin mold excellent in repetition transfer properties using the resin mold, in addition to adhesion to a substrate, such a new issue is clarified that it is necessary to provide a resin mold excellent in release properties between the resin mold and a transfer material resin to which transfer is made using the mold and is further excellent in durability of the resin mold itself.

The present invention was made in view of the respect, and it is an object of the invention to provide a resin mold which is excellent in adhesion to a substrate, excellent in release properties from a transfer material resin, further excellent in durability of the resin mold itself, and which endures repetition transfer to the transfer material resin.

Solution to the Problem

To solve the problem, the inventors of the invention found out that it is possible to obtain a resin mold that enables a concavo-convex shape of the nanometer size to be transferred from resin to resin repeatedly by setting a fluorine element concentration (Es) in a resin surface portion (near the fine concavo-convex structure) in a resin mold at an average fluorine element concentration (Eb) in the resin forming the resin mold or more, more suitably, at concentrations that are higher than an average fluorine element concentration (Es) in the resin surface portion, while lowering the average fluorine element concentration (Eb) in the resin.

By making the fluorine element concentration (Es) in the resin surface portion higher than the average fluorine element concentration (Eb) in the resin, the release properties from the transfer material resin increase in the resin surface portion due to low free energy, and near a substrate in the resin, adhesion to the substrate improves by keeping free energy high. Further, by making the average fluorine element concentration (Eb) in the resin lower relative to the resin surface portion, the strength of the resin itself improves, and it is thereby possible to prepare the resin mold that enables repetition transfer from the resin mold having the concavo-convex shape of the nanometer size to a resin. Furthermore, since it is possible to repeatedly transfer to a resin from the resin mold (B) prepared by transferring from the resin mold (A) to the resin, production efficiency drastically improves, and it is possible to absorb the cost of a generally expensive master stamper. Therefore, the resin mold according to the invention is industrially useful in terms of environmental aspects.

In other words, the invention is as described below.

A resin mold of the invention is a resin mold having a fine concavo-convex structure on the surface, and is characterized in that a fluorine element concentration (Es) in a resin

[Chemistry 2]

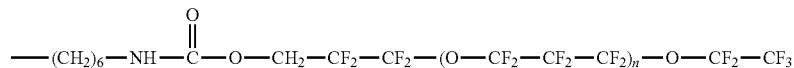

mold surface portion is an average fluorine element concentration (Eb) in the resin forming the resin mold or more.

In the resin mold of the invention, it is preferable that a ratio between the average fluorine element concentration (Eb) in the resin forming the resin mold and the fluorine element concentration (Es) in the resin mold surface portion meets following equation (1).

$$1 \leq Es/Eb \leq 1500 \qquad \text{Eq.(1)}$$

In the resin mold of the invention, it is preferable that total light transmittance at 350 nm to 450 nm is 50% or more.

The resin mold of the invention is preferably comprised of a cured material of a photopolymerizable mixture formed by photo nanoimprint.

In the resin mold of the invention, it is preferable that the photopolymerizable mixture contains (meth)acrylate, fluorine-containing (meth)acrylate and a photoinitiator.

The resin mold of the invention preferably contains 0.1 part by weight to 50 parts by weight of the fluorine-containing (meth)acrylate and 0.01 part by weight to 10 parts by weight of the photoinitiator relative to 100 parts by weight of the (meth)acrylate.

In the resin mold of the invention, in a shape of the fine concavo-convex structure, it is preferable that a pitch ranges from 50 nm to 1,000 nm and that a height ranges from 50 nm to 500 nm.

The resin mold of the invention is preferably for nanoimprint.

In the resin mold of the invention, it is preferable that the ratio between the average fluorine element concentration (Eb) in the resin forming the resin mold and the fluorine element concentration (Es) in the resin mold surface portion meets following equation (2).

$$20 \leq Es/Eb \leq 200 \qquad \text{Eq.(2)}$$

In the resin mold of the invention, it is preferable that the resin mold contains a copolymer comprised of fluorine-containing (meth)acrylate and fluorine-non-containing (meth)acrylate, and that the fluorine-containing (meth)acrylate is expressed by following chemical formula (1) and/or following chemical formula (2).

[Chemistry 1]

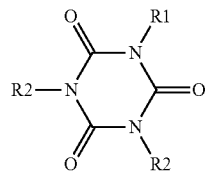   Chemical formula (1)

   Chemical formula (2)

(In chemical formula (1), R1 represents following chemical formula (3), and R2 represents following chemical formula (4).)

(In chemical formula (3), n is an integer of from 1 to 6.)

[Chemistry 3]

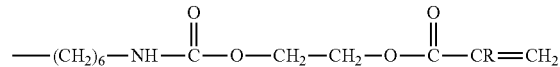

(In chemical formula (4), R is H or CH$_3$.)

The resin mold of the invention preferably contains 0.8 part by weight to 6 parts by weight of the fluorine-containing (meth)acrylate relative to 100 parts by weight of the fluorine-non-containing (meth)acrylate.

A method of manufacturing a resin mold of the invention is a method of manufacturing the above-mentioned resin mold, and is characterized by having the steps of coating a substrate or a master mold with a photopolymerizable mixture containing 100 parts by weight of fluorine-non-containing (meth)acrylate, 0.8 part by weight to 6 parts by weight of fluorine-containing (meth)acrylate, and a photoinitiator, pressing the photopolymerizable mixture between the substrate and the master mold, obtaining a cured material by curing the photopolymerizable mixture by exposure, and peeling off the cured material from the master mold.

Technical Advantageous of the Invention

According to the invention, it is possible to provide a resin mold which is excellent in adhesion to a substrate, excellent in release properties from a transfer material resin, further excellent in durability of the resin mold itself, and which endures repetition transfer to the transfer material resin.

BRIEF DESCRIPTION OF DRAWINGS

FIG. 1 is a diagram showing an example of an arrangement of fine concavo-convex structure of a resin mold according to this Embodiment.

DESCRIPTION OF EMBODIMENTS

An Embodiment of the invention will specifically be described below. In addition, (meth)acrylate means acrylate or methacrylate.

A resin mold according to the invention is a resin mold having a fine concavo-convex structure on the surface, and is characterized in that a fluorine element concentration (Es) in a resin mold surface portion is an average fluorine element concentration (Eb) in the resin forming the resin mold or more.

By making the fluorine concentration in the resin surface (near the fine concavo-convex structure) in the resin mold higher than the average fluorine concentration in the resin mold, it is possible to obtain the mold made of the resin which is excellent in release properties from the transfer material resin in the resin surface due to low free energy, and is further excellent in release properties for enabling the concavo-convex shape of the nanometer size to be resin/resin transferred repeatedly, and by keeping free energy high near a substrate, it is possible to improve adhesion.

Further, when the fluorine element concentration (Es) in the resin mold surface portion is higher than the average fluorine element concentration (Eb) in the resin forming the resin mold, it is possible to obtain the mold made of the resin which is excellent in release properties from the transfer material resin in the resin surface due to low free energy, and is further excellent in release properties for enabling the concavo-convex shape of the nanometer size to be resin/resin transferred repeatedly, while it is possible to more improve adhesion by keeping free energy high near a substrate, and the resin mold is preferable.

Furthermore, the resin mold is a resin mold having a fine concavo-convex structure on the surface, more exerts the above-mentioned effects by the ratio between the average fluorine element concentration (Eb) in the resin forming the resin mold and the fluorine element concentration (Es) in the resin mold surface portion meeting following equation (1), and is more preferable.

$$1 \leq Es/Eb \leq 1500 \qquad \text{Eq.(1)}$$

Still furthermore, the range of $1<Es/Eb \leq 1500$ enables formation of a surface layer with a high fluorine content, thereby improves mold release, and is preferable, and the ranges of from $3 \leq Es/Eb \leq 1500$ to $10 \leq Es/Eb \leq 100$ further improve release properties, and are preferable.

In addition, in the range of $20 \leq Es/Eb \leq 200$ within the aforementioned widest range ($1<Es/Eb \leq 1500$), the fluorine element concentration (Es) in the resin mold surface portion is sufficiently higher than the average fluorine element concentration (Eb) in the resin mold, free energy on the resin surface decreases effectively, and release properties from the transfer material resin thereby improve. Further, by lowering the average fluorine element concentration (Eb) in the resin relative to the fluorine element concentration (Es) in the resin mold surface portion, the strength of the resin itself improves, while free energy can be kept high near the substrate in the resin, and therefore, adhesion to the substrate improves. By this means, it is possible to obtain the resin mold which is excellent in adhesion to the substrate, excellent in release properties from the transfer material resin, and which enables the concavo-convex structure of the nanometer size to be transferred repeatedly from resin to resin, and therefore, such a range is particularly preferable. Further, in the range of $26 \leq Es/Eb \leq 189$, it is possible to further lower free energy on the resin surface, repetition transfer properties are excellent, and therefore, the range is preferable. Furthermore, in the range of $30 \leq Es/Eb \leq 160$, it is possible to maintain the strength of the resin while decreasing free energy on the resin surface, repetition transfer properties further improve, the range is thereby preferable, and the range of $31 \leq Es/Eb \leq 155$ is more preferable. The range of $46 \leq Es/Eb \leq 155$ enables the aforementioned effects to be further exerted, and is preferable.

Further, as described below, it is possible to obtain the resin mold according to the invention by photopolymerization and thermopolymerization, and it is preferable that the resin mold is comprised of a cured material formed from a photopolymerizable mixture by photo nanoimprint. Furthermore, it is preferable that the photopolymerizable mixture contains fluorine-non-containing (meth)acrylate, fluorine-containing (meth)acrylate and a photoinitiator, and the resin mold preferably contains 0.1 part by weight to 50 parts by weight of the fluorine-containing (meth)acrylate and 0.01 part by weight to 10 parts by weight of the photoinitiator relative to 100 parts by weight of the fluorine-non-containing (meth)acrylate.

Release properties are excellent when the fluorine-containing (meth)acrylate is 0.1 part by weight or more, adhesion to the substrate is excellent when the fluorine-containing (meth)acrylate is 50 parts by weight or less, and such content is preferable. Particularly, when the content ranges from 5 parts by weight to 10 parts by weight, surface segregation of the fluorine-containing (meth)acrylate is excellent.

In addition, within the aforementioned range, when the fluorine-containing (meth)acrylate is 0.8 part by weight or more, it is possible to increase the fluorine element concentration (Es) in the resin mold surface portion (fine concavo-convex structure surface), and therefore, the range is more preferable. When the fluorine-containing (meth)acrylate is 6 parts by weight or less, it is possible to decrease the average fluorine element concentration (Eb) in the resin and to increase the bulk strength and adhesion in the interface of the substrate, and the range is more preferable. Furthermore, in the range of 1 part by weight to 6 parts by weight, it is possible to more lower free energy on the resin surface, repetition transfer properties are excellent, and therefore, the range is preferable.

Further, when the above-mentioned fluorine-containing (meth)acrylate is fluorine-containing urethane(meth)acrylate expressed by following chemical formula (1) and/or fluorine-containing (meth)acrylate expressed by following chemical formula (2), it is possible to lower surface free energy more effectively, more improve adhesion to the substrate, and to decrease the average fluorine element concentration (Eb) in the resin to keep the strength of the resin, repetition transfer properties are thereby more improved, and such acrylates are preferable.

[Chemistry 4]

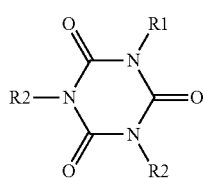

Chemical formula (1)

Chemical formula (2)

(In chemical formula (1), R1 represents following chemical formula (3), and R2 represents following chemical formula (4).)

[Chemistry 5]

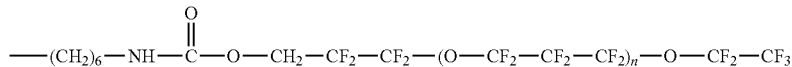

(In chemical formula (3), n is an integer of from 1 to 6.)

[Chemistry 6]

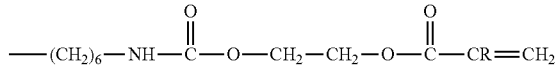

(In chemical formula (4), R is H or $CH_3$).

In the description of the invention, "surface portion of the resin mold" indicates a surface portion of the fine concavo-convex structure of the resin mold, and means a portion in the range of approximately 1% to 10% from the surface side of the resin mold, or a portion of the range of 2 nm to 20 nm, in the thickness direction perpendicular to the surface of the resin mold. Further, in the invention, as the fluorine element concentration (Es) in the surface portion of the resin mold, adopted is a value obtained by an XPS method, described later. In the invention, the fluorine element concentration (Es) is defined using a measurement value in the depth of several nanometers that is a penetration length of X-rays in the XPS method.

Meanwhile, in the description of the invention, as "the average fluorine element concentration (Eb) in the resin forming the resin mold", adopted is a value calculated from the amount of charge or a value capable of being analyzed from gas chromatography-mass spectrometry (GC/MS). In other words, the average fluorine element concentration (Eb) means the fluorine element concentration contained in the resin forming the resin mold. For example, it is possible to identify the average fluorine element concentration (Eb) in the resin by decomposing, by a flask combustion method, a slice obtained by physically peeling off a resin portion of the resin mold comprised of the cured material of the photopolymerizable mixture formed in the shape of a film, and then, applying ion chromatography analysis.

The method of manufacturing the resin mold is not particularly limited, but the method of manufacturing by performing photopolymerization or thermopolymerization on the resin is general. Further, it is possible to obtain a resin forming body by transfer from the resin mold by nanoimprinting, obtain a new resin forming body by photo nanoimprinting by regarding the resin forming body as a resin mold, and use the obtained resin forming body as a resin mold. Described below are the case of synthesizing by photopolymerization and the case of synthesizing by thermopolymerization separately.

(Synthesis by Photopolymerization)

As the photopolymerizable mixture, it is preferable to use fluorine-non-containing (meth)acrylate, fluorine-containing (meth)acrylate and a photoinitiator. By using the mixture with (meth)acrylate, fluorine-containing (meth)acrylate and a photoinitiator mixed, when the mixture is cured with the mixture brought into contact with a hydrophobic interface of low surface free energy or the like, it is possible to adjust so that the fluorine element concentration (Es) in the resin mold surface portion is equal to or more than the average fluorine element concentration (Eb) in the resin forming the resin mold, and, the average fluorine element concentration (Eb) in the resin is lowered.

To prepare the resin mold excellent in release properties in nanopattern transfer, particularly, excellent in repetition transfer properties, in the invention, it is desirable to cure the photopolymerizable mixture with the mixture brought into contact with an interface of low surface free energy or the like, while keeping the average fluorine element concentration (Eb) in the resin low. By this means, the fluorine-containing (meth)acrylate effectively causes segregation to the interface of low free surface energy so as to lower energy of the entire system, Es/Eb further increases, and it is possible to prepare the resin mold excellent in repetition transfer properties. Next, each component used in manufacturing the resin mold according to the invention will be descried below.

(A) (Meth)Acrylate

The (meth)acrylate is not limited as long as the (meth)acrylate is polymerizable monomers except (B) fluorine-containing (meth)acrylates as described later, and preferable are monomers having an acryloyl group or a methacryloyl group, monomers having a vinyl group, and monomers having an allyl group. The monomers having an acryloyl group or a methacryloyl group are more preferable. Then, the monomers are preferably fluorine-non-containing monomers.

Further, polymerizable monomers are preferably polyfunctional monomers provided with a plurality of polymerizable groups, and the number of polymerizable groups is preferably an integer of from 1 to 4 in terms of excellent polymerizable properties. Furthermore, in the case of mixing two kinds of polymerizable monomers or more to use, the average number of polymerizable groups is preferably 1 to 3. In the case of a single kind of monomers, to increase the crosslinking points after polymerization reaction to obtain physical stability (strength, heat resistance, etc.) of the cured material, the monomers are preferably monomers with the number of polymerizable groups being 3 or more. Still furthermore, in the case of monomers with the number of polymerizable groups being 1 or 2, it is preferable to use the monomers together with monomers with the different number of polymerizable groups.

Specific examples of (meth)acrylate monomers include compounds as described below. Among the monomers having an acryloyl group or a methacryloyl group are (meth)acrylic acids, aromatic (meth)acrylates [phenoxyethyl acrylate, benzyl acrylate, etc.], hydrocarbon (meth)acrylates [stearyl acrylate, lauryl acrylate, 2-ethylhexyl acrylate, allyl acrylate, 1,3-butanediol diacrylate, 1,4-butanediol diacrylate, 1,6-hexanediol diacrylate, trimethylolpropane triacrylate, pentaerythritol triacrylate, dipentaerythritol hexaacrylate, etc.], ethereal oxygen atom-containing hydrocarbon (meth)acrylates [ethoxyethyl acrylate, methoxyethyl acrylate, glycidyl acrylate, tetrahydrofurfuryl acrylate, diethylene glycol diacrylate, neopentylglycol diacrylate, polyoxyethylene glycol diacrylate, tripropylene glycol diacrylate, etc.], functional group-containing hydrocarbon (meth)acrylates [2-hydroxyethyl acrylate, 2-hydroxypropyl acrylate, 4-hydroxybutyl vinyl acrylate, N,N-diethylamino ethyl acrylate, N,N-dimethylamino ethyl acrylate, N-vinyl pyrolidone, (dimethylamino)ethyl methacrylate, etc.], and silicone acrylates. Other samples are EO-modified glycerol tri(meth)acrylate, ECH-modified glycerol tri(meth)acrylate, PO-modified glycerol tri(meth)acrylate, pentaerythritol triacrylate, EO-modified phosphoric acid triacrylate, trimethylolpropane tri(meth)acrylate, caprolactone-modified trimethylolpropane tri(meth)acrylate, PO-modified trimethylolpropane tri(meth)acrylate, tris(acryloxyethyl) isocyanurate, EO-modified trimethylolpropane tri(meth)acrylate, dipentaerythritol hexa(meth)acrylate, caprolactone-modified dipentaerythritol hexa(meth)acrylate, dipentaerythritol hydroxy penta(meth)acrylate, alkyl-modified dipentaerythritol penta(meth)acrylate, dipentaerythritol poly(meth)acrylate, ditrimethylol propane tetra(meth)acrylate, alkyl-modified dipentaerythritol tri(meth)acrylate, pentaerythritol ethoxy tetra(meth)acrylate, pentaerythritol tetra(meth)acrylate, di(ethylene glycol) monoethyl ether (meth)acrylate, dimethylol dicyclopentane di(meth)acrylate, di(meth)acrylated isocyanurate, 1,3-butylene glycol di(meth)acrylate, 1,4-butanediol di(meth)acrylate, EO-modified 1,6-hexanediol di(meth)acrylate, ECH-modified 1,6-hexanediol di(meth)acrylate, acryloxy polyethylene glycol acrylate, 1,9-nonanediol di(meth)acrylate, EO-modified bisphenol A di(meth)acrylate, PO-modified bisphenol A di(meth)acrylate, modified-bisphenol A di(meth)acrylate, EO-modified bisphenol F di(meth)acrylate, ECH-modified hexahydrophthalic acid diacrylate, neopentyl glycol di(meth)acrylate, hydroxy pivalic acid neopentyl glycol di(meth)acrylate, EO-modified neopentyl glycol diacrylate, PO-modified neopentyl glycol diacrylate, caprolactone-modified hydroxy pivalic acid ester neopentyl glycol, stearic acid-modified pentaerythritol di(meth)acrylate, ECH-modified propylene glycol di(meth)acrylate, ECH-modified phthalic acid di(meth)acrylate, poly(ethylene glycol-tetramethylene glycol) di(meth)acrylate, poly(propylene glycol-tetramethylene glycol) di(meth)acrylate, polypropylene glycol di(meth)acrylate, silicone di(meth)acrylate, tetraethylene glycol di(meth)acrylate, triethylene glycol di(meth)acrylate, polyester (di)acrylate, polyethylene glycol di(meth)acrylate, dimethylol tricyclodecane di(meth)acrylate, neopentyl glycol-modified trimethylol propane di(meth)acrylate, dipropylene glycol di(meth)acrylate, tripropylene glycol di(meth)acrylate, triglycerol di(meth)acrylate, EO-modified tripropylene glycol di(meth)acrylate, divinyl ethylene urea, divinyl propylene urea, 2-ethyl-2-butyl propanediol acrylate, 2-ethylhexyl (meth)acrylate, 2-ethylhexyl carbitol (meth)acrylate, 2-hydroxyethyl (meth)acrylate, 2-hydroxypropyl (meth)acrylate, 2-hydroxybutyl (meth)acrylate, 2-methoxyethyl (meth)acrylate, 3-methoxybutyl (meth)acrylate, 4-hydroxybutyl (meth)acrylate, acrylic acid dimer, benzyl (meth)acrylate, butanediol mono(meth)acrylate, butoxyethyl (meth)acrylate, butyl (meth)acrylate, cetyl (meth)acrylate, EO-modified cresol (meth)acrylate, ethoxyed phenyl (meth)acrylate, ethyl (meth)acrylate, dipropylene glycol (meth)acrylate, isoamyl (meth)acrylate, isobutyl (meth)acrylate, iso-octyl (meth)acrylate, cyclohexyl (meth)acrylate, dicyclo pentanyl (meth)acrylate, isobornyl (meth)acrylate, dicyclo pentanyl oxyethyl (meth)acrylate, iso myristyl (meth)acrylate, lauryl (meth)acrylate, methoxy dipropylene glycol (meth)acrylate, methoxy polyethylene glycol (meth)acrylate, methoxy triethylene glycol (meth)acrylate, methyl (meth)acrylate, methoxy tripropylene glycol (meth)acrylate, neopentyl glycol benzoate (meth)acrylate, nonylphenoxy polyethylene glycol (meth)acrylate, nonylphenoxy polypropylene glycol (meth)acrylate, octyl (meth)acrylate, paracumyl phenoxy ethylene glycol (meth) acrylate, ECH-modified phenoxy acrylate, phenoxy diethylene glycol (meth)acrylate, phenoxy hexaethylene glycol (meth)acrylate, phenoxy tetraethylene glycol (meth)acrylate, phenoxy diethyl (meth)acrylate, polypropylene glycol (meth)acrylate, polyethylene glycol-polypropylene glycol (meth)acrylate, stearyl (meth)acrylate, EO-modified succinic acid (meth)acrylate, tert-butyl (meth)acrylate, tribromo phenyl (meth)acrylate, EO-modified tribromo phenyl (meth) acrylate, and tridodecyl (meth)acrylate. Examples of monomers having an ally group include p-isopropenyl phenol, and example of monomers having a vinyl group include styrene, α-methyl styrene, acrylonitrile, and vinylcarbazole. In addition, EO-modified means ethylene oxide-modified, ECH-modified means epichlorohydrin-modified, and PO-modified means propylene oxide-modified.

(B) Fluorine-Containing (Meth)Acrylate

As the fluorine-containing meth(acrylate), it is preferably to have a polyfluoroalkylene chain and/or perfluoro (polyoxyalkylene) chain and polymerizable group, and further preferable is a linear perfluoro alkylene group or perfluoro oxyalkylene group having a trifluoromethyl group in the side chain with an ethereal oxygen atom inserted in between carbon atoms. Further, particularly preferable is a linear polyfluoroalkylene chain and/or linear perfluoro (polyoxyalkylene) chain having a trifluoromethyl group in the molecular side chain or molecular structure terminal.

The polyfluoroalkylene chain is preferably a polyfluoroalkylene group with the carbon number of from 2 to 24. Further, the polyfluoroalkylene group may have a functional group.

The perfluoro (polyoxyalkylene) chain is preferably comprised of one kind of perfluoro (oxyalkylene) units or more selected from the group consisting of a $(CF_2CF_2O)$ unit, $(CF_2CF(CF_3)O)$ unit, $(CF_2CF_2CF_2O)$ unit and $(CF_2O)$ unit, and is more preferably comprised of $(CF_2CF_2O)$ units, $(CF_2CF(CF_3)O)$ units or $(CF_2CF_2CF_2O)$ units. The perfluoro (polyoxyalkylene) chain is particularly preferably comprised of $(CF_2CF_2O)$ units, because physical properties (heat resistance, acid resistance, etc.) of the fluorine-containing polymer are excellent. In terms of high release properties and hardness of the fluorine-containing polymer, the number of perfluoro (oxyalkylene) units is preferably an integer of from 2 to 200, and more preferably an integer of from 2 to 50.

As the polymerizable group, among preferable groups are a vinyl group, ally group, acryloyl group, methacryloyl group, epoxy group, dioxetane group, cyano group, isocyanate group and hydrolytic silyl group expressed by formula of —$(CH_2)_aSi(M1)_{3-b}(M2)_b$, and an acryloyl group or methacryloyl group is more preferable. Herein, M1 is a substituent group that is converted into a hydroxyl group by hydrolysis reaction. Examples of such substituent groups are a halogen group, alkoxy group, and acyloxy group. As the halogen atom, a chlorine atom is preferable. As the alkoxy group, a methoxy group or ethoxy group is preferable, and a methoxy group is more preferable. M2 is a monovalent hydrocarbon group. Examples of M2 are an alkyl group, alkyl group substituted by one or more aryl groups, alkenyl group, alkynyl group, cycloalkyl group and aryl group, and an alkyl group or alkenyl group is preferable. When M2 is an alkyl group, alkyl groups with the carbon number of from 1 to 4 are preferable, and a methyl group or ethyl group is more preferable. When M2 is an alkenyl group, alkenyl groups with the carbon of from 2 to 4 are preferable, and a vinyl group or allyl group is more preferable. a is an integer of from 1 to 3, and "3" is preferable. b is 0, or an integer of from 1 to 3, and "0" is preferable. As the hydrolytic silyl group, preferable is $(CH_3O)_3SCH_2-$, $(CH_3CH_2O)_3SCH_2-$, $(CH_3O)_3Si(CH_2)_3$ or $(CH_3CH_2O)_3Si(CH_2)_3-$.

As the number of polymerizable groups, in terms of excellence in polymerizable properties, integers of from 1 to 4 are preferable, and integers of from 1 to 3 are more preferable. When two kinds of compounds or more are used, the average number of polymerizable groups preferably ranges from 1 to 3.

The fluorine-containing (meth)acrylate is excellent in adhesion to transparent substrates having functional groups. Examples of the functional groups are a carboxyl group, sulfone group, functional groups having an ester bond, functional groups having an amide bond, hydroxyl group, amino group, cyano group, urethane group, isocyanate group and functional groups having derivatives of isocyanuric acid. Particularly, it is preferable to contain at least one functional group of a carboxyl group, urethane group, and functional groups having derivatives of isocyanuric acid. In addition, the derivatives of isocyanuric acid include structures having backbone of isocyanuric acid with at least one of hydrogen atoms bound to a nitrogen atom substituted by another group. As the fluorine-containing (meth)acrylate, it is possible to use fluoro(meth)acrylates, fluorodienes, etc. Specific examples of the fluorine-containing (meth)acrylate are compounds as described below.

Among fluoro(meth)acrylates are $CH_2$=$CHCOO(CH_2)_2(CF_2)_{10}F$, $CH_2$=$CHCOO(CH_2)_2(CF_2)_8F$, $CH_2$=$CHCOO(CH_2)_2(CF_2)_6F$, $CH_2$=$C(CH_3)COO(CH_2)_2(CF_2)_{10}F$, $CH_2$=$C(CH_3)COO(CH_2)_2(CF_2)_8F$, $CH_2$=$C(CH_3)COO(CH_2)_2(CF_2)_6F$, $CH_2$=$CHCOOCH_2(CF_2)_6F$, $CH_2$=$C(CH_3)COOCH_2(CF_2)_6F$, $CH_2$=$CHCOOCH_2(CF_2)_7F$, $CH_2$=$C(CH_3)COOCH_2(CF_2)_7F$, $CH_2$=$CHCOOCH_2CF_2CF_2H$, $CH_2$=$CHCOOCH_2(CF_2CF_2)_2H$, $CH_2$=$CHCOOCH_2(CF_2CF_2)_4H$, $CH_2$=$C(CH_3)COOCH_2(CF_2CF_2)_2H$, $CH_2$=$C(CH_3)COOCH_2(CF_2CF_2)_4H$, $CH_2$=$CHCOOCH_2CF_2OCF_2CF_2OCF_3$, $CH_2$=$CHCOOCH_2CF_2O(CF_2CF_2O)_3CF_3$, $CH_2$=$C(CH_3)COOCH_2CF_2OCF_2CF_2OCF_3$, $CH_2$=$C(CH_3)CO\text{-}OCH_2CF_2O(CF_2CF_2O)_3CF_3$, $CH_2$=$CHCOOCH_2CF(CF_3)OCF_2CF(CF_3)O(CF_2)_3F$, $CH_2$=$CHCOOCH_2CF(CF_3)O(CF_2CF(CF_3)O)_2(CF_2)_3F$, $CH_2$=$C(CH_3)COOCH_2CF(CF_3)OCF_2CF(CF_3)O(CF_2)_3F$, $CH_2$=$C(CH_3)COOCH_2CF(CF_3)O(CF_2CF(CF_3)O)_2(CF_2)_3F$, $CH_2$=$CFCOOCH_2CH(OH)CH_2(CF_2)_6CF(CF_3)_2$, $CH_2$=$CFCOOCH_2CH(CH_2OH)CH_2(CF_2)_6CF(CF_3)_2$, $CH_2$=$CFCOOCH_2CH(OH)CH_2(CF_2)_{10}F$, $CH_2$=$CFCOOCH_2CH(OH)CH_2(CF_2)_{10}F$, $CH_2$=$CHCOOCH_2CH_2(CF_2CF_2)_3CH_2CH_2OCOCH$=$CH_2$, $CH_2$=$C(CH_3)COOCH_2CH_2(CF_2CF_2)_3CH_2CH_2OCOC(CH_3)$=$CH_2$, $CH_2$=$CHCOOCH_2CyFCH_2OCOCH$=$CH_2$, and $CH_2$=$C(CH_3)COOCH_2CyFCH_2OCOC(CH_3)$=$CH_2$ (in addition, CyF represents a perfluoro(1,4-cyclohexylene group).)

Among fluorodienes are $CF_2$=$CFCF_2CF$=$CF_2$, $CF_2$=$CFOCF_2CF$=$CF_2$, $CF_2$=$CFOCF_2CF_2CF$=$CF_2$, $CF_2$=$CFOCF(CF_3)CF_2CF$=$CF_2$, $CF_2$=$CFOCF(CF_3)CF$=$CF_2$, $CF_2$=$CFOCF_2OCF$=$CF_2$, $CF_2$=$CFOCF_2CF(CF_3)OCF_2CF$=$CF_2$, $CF_2$=$CFCF_2C(OH)(CF_3)CH_2CH$=$CH_2$, $CF_2$=$CFCF_2C(OH)(CF_3)CH$=$CH_2$, $CF_2$=$CFCF_2C(CF_3)(OCH_2OCH_3)CH_2CH$=$CH_2$, and $CF_2$=$CFCH_2C(C(CF_3)_2OH)(CF_3)CH_2CH$=$CH_2$.

In addition, when the fluorine-containing (meth)acrylate used in the invention is fluorine-containing urethane (meth)acrylate expressed by following chemical formula (1), it is possible to increase the fluorine element concentration (Es) of the resin mold surface portion effectively with the average fluorine element concentration (Eb) in the resin decreased, the resin mold exhibits adhesion to the substrate and release properties more effectively, and the urethane (meth)acrylates are thus more preferable. As such urethane (meth)acrylates, for example, it is possible to use "OPTOOL™ DAC" made by Daikin Industries, Ltd.

[Chemistry 7]

Chemical formula (1)

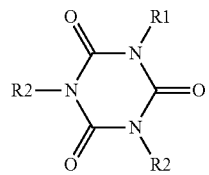

(In chemical formula (1), R1 represents following chemical formula (3), and R2 represents following chemical formula (4).)

[Chemistry 8]

Chemical formula (3)

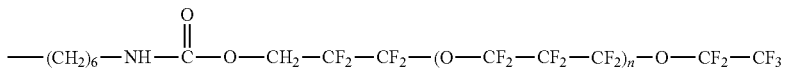

$-(CH_2)_6-NH-\overset{O}{\underset{\|}{C}}-O-CH_2-CF_2-CF_2-(O-CF_2-CF_2-CF_2)_n-O-CF_2-CF_3$ (In chemical formula (3), n is an integer of from 1 to 6.)

[Chemistry 9]

Chemical formula (4)

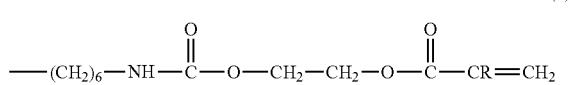

$-(CH_2)_6-NH-\overset{O}{\underset{\|}{C}}-O-CH_2-CH_2-O-\overset{O}{\underset{\|}{C}}-CR=CH_2$ (In chemical formula (4), R is H or $CH_3$.)

As the fluorine-containing meth(acrylate), one kind may be used only, or two kinds or more may be used together. Further, it is possible to use a surface modifier(s) for abrasion resistance, scratch resistance, fingerprint adhesion prevention, antifouling property, leveling properties, water repellency, oil repellency and the like together. For example, among such modifiers are FTERGENT made by NEOS Company Limited (for example, M series: FTERGENT 251, FTERGENT 215M, FTERGENT 250, FTX-245M, FTX-290M; S series: FTX-207S, FTX-211S, FTX-220S, FTX-230S; F series: FTX-209F, FTX-213F, FTERGENT 222F, FTX-233F, FTERGENT 245F; G series: FTERGENT 208G, FTX-218G, FTX-230G, FTS-240G; Oligomer series: FTERGENT 730FM, FTERGENT 730LM, FTERGENT P series: FTERGENT 710FL, FTX-710HL, etc.), "MEGA- FAC" made by DIC Corporation (for example, F-114, F-410, F-493, F-494, F-443, F-444, F-445, F-470, F-471, F-474, F-475, F-477, F-479, F-480SF, F-482, F-483, F-489, F-172D, F-178K, F-178RM, MCF-350SF, etc.), "OPTOOL™" (for example, DSX, DAC, AES), "EFTONE™" (for example, AT-100), "ZEFFLE™" (for example, GH-701), "uNDy™" "DAIFREE™" and "OPTOACE™" made by Daikin Industries, Ltd., "NOVEC EGC-1720" made by Sumitomo 3M Limited, and "FLUORO SURF" made by Fluoro Technology.

In the fluoro-containing (meth)acrylate, the molecular weight Mw preferably ranges from 50 to 50,000, preferably ranges from 50 to 5,000 from the viewpoint of compatibility, and more preferably ranges from 100 to 5,000. In using high molecular weights with low compatibility, a diluent solvent may be used. As the diluent solvent, preferable are diluent solvents in which the boiling point of a single solvent ranges from 40° C. to 180° C., the range of 60° C. to 180° C. is more preferable, and the range of 60° C. to 140° C. is further preferable. Two kinds of diluent solvents or more may be used.

The solvent content is at least an amount capable of being dispersed in the curable resin composition, and preferably ranges from exceeding 0 part by weight to 50 parts by weight relative to 100 parts by weight of curable composition. In consideration of possible removal of remaining solvent amount after drying, the range of exceeding 0 part by weight to 10 parts by weight is more preferable.

Particularly, when the solvent is contained to improve leveling properties, the solvent content is preferably in the range of 0.1 part by weight to 40 parts by weight relative to 100 parts by weight of (meth)acrylate. The solvent content is more preferably in the range of 0.5 part by weight to 20 parts by weight because it is possible to maintain curing properties of the photopolymerizable mixture, and is further preferably in the range of 1 part by weight to 15 parts by weight. When the solvent is contained to thin the film thickness of the photopolymerizable mixture, the solvent content is preferably in the range of 300 parts by weight to 10,000 parts by weight relative to 100 parts by weight of (meth)acrylate because it is possible to maintain solution stability in the dry step after coating, and is more preferably in the range of 300 parts by weight to 1,000 parts by weight.

(C) Photoinitiator

The photoinitiator causes radical reaction or ion reaction by light, and is preferably photoinitiators that cause radical reaction. Among the photoinitiators are photoinitiators as described below.

Acetophenone-series photoinitiators: acetophenone, p-tert-butyltrichloro acetophenone, chloro acetophenone, 2-2-diethoxy acetophenone, hydroxy acetophenone, 2,2-dimethoxy-2'-phenyl acetophenone, 2-amino acetophenone, dialkylamino acetophenone, etc. Benzoin-series photoinitiators: benzyl, benzoin, benzoin methyl ether, benzoin ethyl ether, benzoin isopropyl ether, benzoin isobutyl ether, 1-hydroxycyclohexyl phenyl ketone, 2-hydroxy-2-methyl-1-phenyl-2-methylpropane-1-one, 1-(4-isopropylphenyl)-2-hydroxy-2-methylpropane-1-one, benzyl dimethyl ketal, etc. Benzophenone-series photoinitiators: benzophenone, benzoylbenzoic acid, methyl benzoyl benzoate, methyl-o-benzoyl benzoate, 4-phenyl benzophenone, hydroxy benzophenone, hydroxypropyl benzophenone, acrylic benzophenone, 4-4'-bis(dimethylamino)benzophenone, perfluoro benzophenone, etc. Thioxanthone-series photoinitiators: thioxanthone, 2-chloro thioxanthone, 2-methyl thioxanthone, diethyl thioxanthone, dimethyl thioxanthone, etc. Anthraquinone-series photoinitiators: 2-methyl anthraquinone, 2-ethyl anthraquinone, 2-tert-butyl anthraquinone, 1-chloro anthraquinone, 2-amyl anthraquinone. Ketal-series photoinitiators: acetophenone dimethyl ketal, benzyl dimethyl ketal. Other photoinitiators: α-acyl oxime ester, benzyl-(o-ethoxycarbonyl)-α-monoxime, acyl phosphine oxide, glyoxy ester, 3-keto coumarin, 2-ethyl anthraquinone, camphor quinone, tetramethylthiuram sulfide, azo bis isobutyl nitrile, benzoyl peroxide, dialkyl peroxide, tert-butyl peroxy pivalate, etc. Photoinitiators having fluorine atoms: perfluoro tert-butyl peroxide, perfluoro benzoyl peroxide, etc. It is possible to use these well-known common-use photoinitiators alone or in combination of two kinds or more.

The photopolymerizable mixture may contain a photosensitizer. Specific examples of the photosensitizer are n-butylamine, di-n-butylamine, tri-n-butylphosphine, allylthiourea, s-benzyl isothiuronium-p-toluenesulfinate, triethylamine, diethylaminoethyl methacrylate, triethylenetetramine, 4,4'-bis(dialkylamino)benzophenone, N,N-dimethylamino benzoic acid ethyl ester, N,N-dimethylamino benzoic acid isoamyl ester, pentyl-4-dimethylamino benzoate, triethylamine, and triethanolamine, and it is possible to combine with one, or two kinds or more of well-known common-use aforementioned amines to use.

Examples of commercially available photoinitiators are "IRGACURE" (for example, IRGACURE 651, 184, 500, 2959, 127, 754, 907, 369, 379, 379EG, 819, 1800, 784, OXE01, OXE02) and "DAROCUR" (for example, DAROCUR 1173, MBF, TPO, 426) made by Ciba.

As the photoinitiator, one kind may be used alone, or two kinds or more may be used together. When two kinds or more are used together, it is preferable to select from the viewpoints of dispersion properties of the fluorine-containing meth(acrylate), and curing properties of fine concavo-convex structure surface portion and inside of the photopolymerizable mixture. For example, an α-hydroxy ketone-series photoinitiator and α-amino ketone-series photoinitiator may be used together. Further, as combinations in the case of using two kinds together, examples of the combinations of two kinds of "IRGACURE", and "IRGACURE" and "DAROCURE" are DAROCURE 1173 and IRGACURE 819, IRGACURE 379 and IRGACURE 127, IRGACURE 819 and IRGACURE 127, IRGACURE 250 and IRGACURE 127, IRGACURE 184 and IRGACURE 369, IRGACURE 184 and IRGACURE 379EG, IRGACURE 184 and IRGACURE 907, IRGACURE 127 and IRGACURE 379EG IRGACURE 819 and IRGACURE 184, and DAROCURE TPO and IRGACURE 184.

(D) Photopolymerizable Mixture

The photopolymerizable mixture is a photopolymerizable mixture containing 0.1 part by weight to 50 parts by weight of fluorine-containing (meth)acrylate and 0.01 part by weight to 10 parts by weight of the photoinitiator relative to 100 parts by weight of (meth)acrylate. Particularly, as the aforementioned (meth)acrylate, preferable is fluorine-non-containing (meth)acrylate.

Relative to 100 parts by weight of (meth)acrylate, particularly, fluorine-non-containing (meth)acrylate, 0.1 part by weight or more of fluorine-containing (meth)acrylate provides excellent release properties and is preferable, and 50 parts by weight or less of fluorine-containing (meth)acrylate provides excellent adhesion to the substrate and is preferable. In addition, 0.8 part by weight or more of (meth)acrylate enables the fluorine element concentration (Es) of the resin mold surface portion (fine concavo-convex structure surface) to be increased, and therefore, is more preferable, and 6 parts by weight or less of (meth)acrylate enables the average fluorine element concentration (Eb) in the resin to be decreased, while enabling bulk strength and adhesion to the substrate interface to be increased, and therefore, is more preferable. Further, the (meth)acrylate in the range of 1 part by weight to 6 parts by weight enables free energy on the resin surface to be more decreased, provides excellent repetition transfer properties, and is therefore preferable.

Meanwhile, as the photoinitiator, relative to 100 parts by weight of (meth)acrylate, particularly, fluorine-non-containing (meth)acrylate, the content of 0.01 part by weight or more provides excellent polymerizable properties, the content of 10 parts by weight or less reduces bleedout of unreacted initiator and/or decomposition product to the resin surface after curing, and therefore, such a range is preferable. The photoinitiator is more preferably 0.5 part by weight or more, and further preferably 1 part by weight or more. Meanwhile, the photo-hardener is more preferably 5 parts by weight or less. The photoinitiator in the range of 0.5 part by weight to 5 parts by weight is excellent in resin transmittance after curing.

When the solvent is contained to improve leveling properties, the solvent content is preferably in the range of 0.1 part by weight to 40 parts by weight relative to 100 parts by weight of (meth)acrylate. The solvent content is more preferably in the range of 0.5 part by weight to 20 parts by weight because it is possible to maintain curing properties of the photopolymerizable mixture, and is further preferably in the range of 1 part by weight to 15 parts by weight. When the solvent is contained to thin the film thickness of the photopolymerizable mixture, the solvent content is preferably in the range of 300 parts by weight to 10,000 parts by weight relative to 100 parts by weight of (meth)acrylate because it is possible to maintain solution stability in the dry step after coating, and is more preferably in the range of 300 parts by weight to 1,000 parts by weight.

(E) Resin Mold (Stamper Forming Body Made of Resin)

Hereinafter, the resin mold is expressed by F. In portions to explain the pattern shape or inversed shape of the pattern shape, concavo-convex or convexo-concave pattern is expressed. Among the patterns, the resin mold according to the invention provided with the concavo-convex pattern shape is expressed by F(+), and a resin mold provided with the convexo-concave pattern shape transferred from F(+) is expressed by F(−).

In the invention, by using the cured material of the photopolymerizable mixture (hereinafter, referred to as a curable resin composition), it is possible to form the resin mold. The resin mold is a resin forming body provided on the resin surface with a fine concavo-convex pattern shape (fine concavo-convex structure) obtained by photo nanoimprint transfer from a master mold provided on the surface with the fine pattern shape using a curable resin composition as a transfer agent. Further, in the invention, as well as the curable resin composition according to the invention, the resin forming body is capable of being used as a mold made of the resin for enabling transfer to inorganic materials including curing by sol-gel reaction and further enabling repetition transfer of photo nanoimprint transfer to well-known photosensitive resin compositions. "Repetition transfer" herein means either or both of the following two cases ((1), (2)).

(1) To manufacture a plurality of concavo-convex pattern transfer materials transferred from the F(+) resin mold provided with the convexo-concave pattern.

(2) When the curable resin composition is used as a transfer agent, it is possible to obtain the F(−) transfer material inverted from the resin mold F(+), and next, by using the F(−) transfer material as a mold, perform repetition inversion transfer of convexo-concave/concavo-convex/convexo-concave/concavo-convex/ . . . / to obtain the inversion transferred F(+) transfer materials.

(Fine Concavo-Convex Pattern Shape).

The surface of the resin mold is of structure obtained by transferring the shape of the master mold, and is provided with the fine concavo-convex structure. The structures suitable for optical members and bio-members are preferable, the shape of a grid, pillar/hole structure and the like are more preferable, and the concavo-convex shape in cross section of the members may be a rectangle, square, trapezoid, rhombus, hexagon, triangle, circle, shape with the curvature, etc. Further, as the pattern arrangement, it is possible to use either the shape of random arrangement or the pattern shape of periodical arrangement. Particularly, in the case of the shape with the pattern periodically arranged, the periodical pitch size is preferably in the range of 50 nm to 1,000 nm, more preferably in the range of 80 nm to 700 nm, and further preferably in the range of 100 nm to 250 nm. The height of the concavo-convex pattern is preferably in the range of 50 nm to 500 nm, and is more preferably in the range of 100 nm to 250 nm. Further, the aspect ratio of the shape in cross section of the concave portion or the convex portion is preferably in the range of 0.5 to 10, and more preferably in the range of 1 to 5. Herein, the aspect ratio is defined as a value (a/b) obtained by dividing the height (a) of the shape in cross section of the concave portion or the convex portion by a half-value width (b) in the height position of a/2.

FIG. 1 shows an example of the arrangement of the fine concavo-convex structure of the resin mold. In addition, in FIG. 1, the plan view of the resin mold surface is schematically shown, and the mutually perpendicular directions in the resin mold surface are represented as the first direction and the second direction.

In the example as shown in FIG. 1, the fine concavo-convex structure includes a plurality of convex-portion lines (or concave-portion lines) in each of which a plurality of convex portions (or concave portions) is arranged with a pitch P in the first direction. The convex-portion lines (or concave-portion lines) are mutually spaced and arranged with a pitch S in the second direction. Further, each convex-portion line (or concave-portion line) is arranged so that respective convex portions (or respective concave portions) belonging to mutually adjacent convex-portion lines cause a position difference α in the first direction. Herein, the position difference α is the distance between center portions of the closet convex portions (or center portions of the closest concave portions) in the first direction among respective convex portions (or respective concave portions) belonging to mutually adjacent convex-portion lines (or concave-portion lines). For example, as shown in FIG. 1, the position difference α means the distance between the segment in the second direction passing through the center of each convex portion (or each concave portion) belonging to the Nth convex-portion line (or concave-portion line) and the segment in the second direction passing through the center of each convex portion (or each concave portion) belonging to the (N+1)th convex-portion line (or concave-portion line) adjacent to the Nth line. In addition, in each convex-portion line, the position difference α in the first direction may be arranged periodically or arranged non-periodically between adjacent convex-portion lines in the section direction. Further, the pitch P and the pitch S are capable of being designed as appropriate corresponding to intended uses.

For example, in the case of desiring to suppress the reflectance and increase the transmittance in the visible-light region (400 nm to 780 nm), the distance between adjacent convex portions is preferably in the range of 1 nm to 300 nm, and more preferably in the range of 1 nm to 150 nm. Thus, when the distance between adjacent convex portions is 150 nm or less, it is possible to also suppress the angle dependence of reflectance without causing diffraction light in the visible-light region. Similarly, the height of the convex portion is preferably in the range of 1 nm to 1,000 nm, and is more preferably in the range of 100 nm to 500 nm. Although the higher convex-portion height is preferable, when the aspect ratio that is the ratio between the adjacent distance and the height is 3 or more, the fine structure layered body is hard to release in transferring to an inorganic substrate. Therefore, based on the above-mentioned design idea, it is preferable to design the fine concavo-convex structure so that the aspect ratio is less than 3.

Further, for example, since the spectral sensitivity of crystal-system silicon solar battery has the peak in the far-infrared region (700 nm to 1,000 nm), the uppermost surface member for the solar battery is required to have excellent transmittance in this wavelength region. In the case of thus desiring to suppress the reflectance and increase the transmittance in the far-infrared region, the distance between adjacent convex portions is preferable in the range of 300 nm to 2,000 nm, and more preferably, in the range of 500 nm to 1,000 nm. Further, the height of the convex portion is preferably in the range of 1 nm to 5,000 nm, and is more preferably in the range of 1,000 nm to 5,000 nm. In addition, also in this case, it is preferable to design the fine concavo-convex structure so that the aspect ratio is less than 3.

Furthermore, for example, in the case of forming the fine concavo-convex structure on the interface between TCO constituting the LED and a sealing agent or on the sapphire of the flip-chip type LED to improve light-extraction efficiency of the LED, the distance between adjacent convex portions is preferably in the range of 250 nm to 10,000 nm, and since light-extraction efficiency by diffraction light is improved, is more preferably in the range of 500 nm to 5,000 nm. In addition, also in this case, it is preferable to design the fine concavo-convex structure so that the aspect ratio is less than 3.

Molds or transfer materials are preferable which enable transfer to be performed with a precision of transfer of 80% or more of the cross-sectional area ratio (S concave/S convex×100) of the concave-portion cross-sectional area (S concave portion) of the inverted transfer forming body (general-purpose photosensitive resin and resin mold) to the convex-portion cross-sectional area (S convex portion) of the material (master mold and resin mold) to be transferred as the mold. Particularly, when the resin mold is the mold, the precision of transfer is more preferably 80% or more. Further, to hold a high degree of precision of transfer in repetition inversion transfer of concavo-convex/convexo-concave/concavo-convex/convexo-concave/ . . . , the precision of transfer at a time is preferably 85% or more, and is more preferably 90% or more.

(Master Mold)

The master mold is provided on the surface with the fine concavo-convex pattern, and examples of the materials are quartz glass, UV transmission glass, sapphire, diamond, silicone materials such as polydimethyl siloxane, fluorine resin, silicon wafer, SiC substrate, and mica substrate. Release treatment may be performed to further improve release properties in nanoimprint transfer.

Particularly, free energy on the master mold surface lowers by applying release treatment to the master mold.

Therefore, by performing transfer with the average fluorine element concentration (Eb) in the resin kept low, the fluorine-containing (meth)acrylate according to the invention effectively causes segregation to the master mold surface so as to lower energy of the entire system comprised of the master mold/photosensitive resin mixture/substrate, and it is thereby possible to increase Es/Eb. Therefore, it is possible to prepare the resin forming body excellent in repetition transfer properties.

In addition, from the viewpoint of durability of the release treatment to the master mold, silane coupling-series releasing agents are preferable as the release treatment agent. Examples of commercially-available releasing agents are OPTOOL DSX, DURASURF HD1101 and DURASURF HD2101 made by Daikin Industries, Ltd. and Novec made by Sumitomo 3M Limited.

In the aforementioned description, each component used in manufacturing of the resin mold according to the invention is described specifically. Described next is the method of manufacturing the resin mold using each component as described above.

(F) Method of Manufacturing the Resin Mold

By performing following steps 11 to 14 sequentially, it is possible to prepare a resin mold from a master mold using the curable resin composition according to the invention as a transfer agent.

Step 11: Step of coating the curable resin composition on a substrate (step of coating the resin).

Step 12: Step of pressing the curable resin composition against the master mold in the above-mentioned step 11 (step of pressing the resin against the mold).

Step 13: Step of causing the curable resin composition to undergo photo-radical polymerization in the above-mentioned step 12 to obtain the cured material (step of photo-curing the resin).

Step 14: Step of peeling off the cured material from the master mold, and obtaining the resin mold (F) provided with the inversion shape of the pattern shape of the master mold (step of peeling off the cured material from the mold).

By performing following steps 21 to 28 sequentially, it is possible to manufacture the resin mold (F) provided with the same concavo-convex pattern shape as the concavo-convex pattern shape of the master mold.

Step 21: Step of coating the curable resin composition on a substrate ((step of coating the resin).

Step 22: Step of pressing the curable resin composition against the master mold in the above-mentioned step 21 (step of pressing the resin against the mold).

Step 23: Step of causing the curable resin composition to undergo photo-radical polymerization in the above-mentioned step 22 to obtain the cured material (step of photo-curing the resin).

Step 24: Step of peeling off the cured material from the master mold in the above-mentioned step 23, and obtaining the resin mold (F(+)) provided with the inversion shape of the master mold shape (step of peeling off the cured material from the mold).

Step 25: Step of coating the curable resin composition on a substrate (step of coating the resin).

Step 26: Step of pressing the curable resin composition against the resin mold in the above-mentioned step 25 (step of pressing the resin against the mold).

Step 27: Step of causing the curable resin composition to undergo photo-radical polymerization in the above-mentioned step 26 to obtain the cured material (step of photo-curing the resin).

Step 28: Step of peeling off the cured material from the resin mold (F(+)) in the above-mentioned step 27, and obtaining the resin mold (F(−)) provided with the same pattern shape as the pattern shape of the master mold.

(Step of Peeling Off the Cured Material from the Mold)

By performing following steps 31 to 34 sequentially, it is possible to manufacture a resin transfer material provided with the above-mentioned inversion shape from the resin mold using a well-known common-use photosensitive resin composition as a transfer agent.

Step 31: Step of coating a well-known common-use photosensitive resin composition on a substrate (step of coating the resin).

Step 32: Step of pressing the photosensitive resin composition against the resin mold in the above-mentioned step 31 (step of pressing the resin against the mold).

Step 33: Step of causing the photosensitive resin composition to undergo photo-radical polymerization in the above-mentioned step 32 to obtain the cured material (step of photo-curing the resin).

Step 34: Step of peeling off the cured material from the resin mold in the above-mentioned step 33, and obtaining the transfer material provided with the inversion shape of the pattern shape of the resin mold (F) (step of peeling off the cured material from the mold).

By performing following steps 41 to 47 sequentially, it is possible to manufacture a roll stamper made of a resin such that the resin mold forming body is processed in the shape of a roll.

Step 41: Step of coating the curable resin composition on a substrate (step of coating the resin).

Step 42: Step of pressing the curable resin composition against the master mold in the above-mentioned step 41 (step of pressing the resin against the mold).

Step 43: Step of causing the curable resin composition to undergo photo-radical polymerization in the above-mentioned step 42 to obtain the cured material (step of photo-curing the resin).

Step 44: Step of peeling off the cured material from the master mold in the above-mentioned step 43, and obtaining the resin mold (F(+)) provided with the inversion shape of the master mold shape (step of peeling off the cured material from the mold).

Step 45: Step of sandwiching the curable resin composition between the resin mold (F(+)) prepared in the above-mentioned step 44 and a roll substrate (step of pressing the resin against the mold).

Step 46: Step of causing the curable resin composition to undergo photo-radical polymerization in the above-mentioned step 45 to obtain the cured material (step of photo-curing the resin).

Step 47: Step of peeling off the cured material from the resin mold (F(+)) in the above-mentioned step 46, and obtaining a roll stamper made of the resin (F(−)) provided with the same pattern shape as the pattern shape of the master mold (step of peeling off the cured material from the mold).

By performing following steps 51 to 54 sequentially, it is possible to perform roll-to-roll type successive transfer with a photosensitive resin composition as a transfer agent, using the roll stamper forming body made of the resin prepared in the sequence of above-mentioned steps 41 to 47. Particularly, when the curable resin composition according to the invention is used as a transfer agent, it is possible to use a transfer product undergoing successive transfer as a resin mold successive forming body.

Step 51: Step of coating a photosensitive resin composition on a substrate (step of coating the resin).

Step 52: Step of pressing the photosensitive resin composition against the roll stamper made of the resin in the above-mentioned step 51 (step of pressing the resin against the mold).

Step 53: Step of causing the photosensitive resin composition to undergo photo-radical polymerization in the above-mentioned step 52 to obtain the cured material (step of photo-curing the resin).

Step 54: Step of peeling off the cured material from the resin mold (F) in the above-mentioned step 53, and enabling the transfer material provided with the inversion shape of the pattern shape of the resin mold (F) to be manufactured successively (step of peeling off the cured material from the mold).

By performing following steps 61 to 64 sequentially, it is possible to perform successive transfer of the pattern shape of from a successive body to a successive body, using the resin mold successive forming body prepared in the sequence of above-mentioned steps 51 to 54.

Step 61: Step of coating a photosensitive resin composition on a substrate (step of coating the resin).

Step 62: Step of pressing the photosensitive resin composition against the resin mold (F) successive forming body in the above-mentioned step 61 (step of pressing the resin against the mold).

Step 63: Step of causing the photosensitive resin composition to undergo photo-radical polymerization in the above-mentioned step 62 to obtain the cured material (step of photo-curing the resin).

Step 64: Step of peeling off the cured material from the resin mold (F) successive forming body in the above-mentioned step 63, and enabling the transfer material provided with the inversion shape of the pattern shape of the resin mold (F) to be manufactured successively (step of peeling off the cured material from the mold).

Details of each step will be described below.

(Step of Coating the Resin Composition on a Substrate)

Examples of the method of coating the resin composition on a substrate are a flow expanding method, potting method, spin coating method, roller coating method, bar coating method, casting method, dip coating method, die coating method, Langmuir-Blodgett method, spray coating method, air-knife coating method, flow coating method, and curtain coating method. The coating thickness of the curable resin composition preferably ranges from 50 nm to 5 mm, more preferably ranges from 100 nm to 200 μm, and further preferably ranges from 100 nm to 100 μm.

When the substrate is larger than the master mold or the resin mold, the resin composition may be coated on the entire surface of the substrate, or may be coated on a part of the substrate so that the resin composition exists only in the range die-pressed against the master mold or the resin mold.

By performing pre-baking after coating the substrate with the resin composition, it is possible to remove the solvent when the solvent is contained, or to promote surface segregation of the fluorine-containing polymerizable (meth)acrylate contained therein. By causing segregation of the fluorine-containing polymerizable (meth)acrylate contained therein to the surface, in pressing against the master mold or the resin mold, the fluorine-containing polymerizable (meth)acrylate is efficiently filled into the inside of the fine structure of the master mold or the resin mold, and not only suppression of deterioration of the master mold or the resin mold, it is also possible to significantly increase the value Es/Eb obtained by dividing the surface fluorine element concentration (Es) of the obtained resin mold by the fluorine element concentration (Eb) of the bulk, and to improve release properties. The temperature preferably ranges from 25° C. to 120° C., more preferably ranges from 40° C. to 105° C., further preferably ranges from 50° C. to 105° C., and most preferably ranges from 60° C. to 105° C. The pre-bake time preferably ranges from 30 seconds to 30 minutes, more preferably ranges from 1 minute to 15 minutes, and further preferably ranges from 3 minutes to 10 minutes.

Materials of the substrate are not limited particularly, and it is possible to use both inorganic materials such as glass, ceramic and metal and organic materials such as plastic. Corresponding to the uses of the forming body, it is possible to use a plate, sheet, film, thin film, woven fabric, nonwoven fabric, any other shapes and complex thereof, and it is particularly preferable to include a sheet, film, thin film, woven fabric, nonwoven fabric and the like which have flexibility and are excellent in successive productivity. Examples of the materials having flexibility are amorphous thermoplastic resins such as methyl polymethacrylate resin, polycarbonate resin, polystyrene resin, cycloolefin resin (COP), cross-linked polyethylene resin, polyvinyl chloride resin, polyacrylate resin, polyphenylene ether resin, modified polyphenylene ether resin, polyether imide resin, polyether sulfone resin, polysulfone resin and polyether ketone resin, crystalline thermoplastic resins such as polyethylene terephthalate (PET) resin, polyethylene naphthalate resin, polyethylene resin, polypropylene resin, polybutylene terephthalate resin, aromatic polyester resin, polyacetal resin, and polyamide resin, ultraviolet (UV) curable resins of acrylic resin, epoxy resin, urethane resin and the like, and thermosetting resins. Further, it is possible to combine the UV-curable resin and thermosetting resin, inorganic substrate of glass or the like, the above-mentioned thermoplastic resin, and triacetate resin, or use alone to form the substrate.

It is preferable to apply treatment for improving adhesion between the substrate and the resin composition. For example, it is preferable to apply, to the surface of the substrate to be bonded, easy adhesion coating, primer treatment, corona treatment, plasma treatment, UV/ozone treatment, high-energy irradiation treatment, surface roughening treatment, porous treatment or the like for chemical bond to the resin composition and physical bond such as permeation.

(Step of Pressing the Resin Composition Against the Substrate)

It is preferable to cover the mold (master mold, resin mold, roll stamper made of the resin or the like) with the substrate high in flexibility gently from the end while preventing bubbles from entering, and press under a certain pressure. The press force in pressing preferably ranges from exceeding 0 MPa to 10 MPa, more preferably ranges from 0.01 MPa to 5 MPa, and further preferably ranges from 0.01 MPa to 1 MPa.

(Step of Photo-Curing the Resin)

When optical transparency of the master mold is low, it is preferable to expose from the substrate side. Meanwhile, the master mold has high transmittance to light of UV wavelengths, for example, in the case of synthetic quartz material, it is preferable to expose from at least one side surface on the substrate side or the master mold side, and it is more preferable to expose from the both surfaces on the substrate side and the master mold side. In the case of using the resin mold, it is preferable to expose from at least one side surface on the substrate side or the resin mold (F) side, and it is more preferable to expose from the both surfaces on the substrate side and the resin mold (F) side. It is also possible to coat the master mold only with the curable resin composition without using the substrate to cure. In this case, to prevent polymerization from being inhibited by oxygen, it is possible to manufacture the cured material by a method of exposing in an atmosphere of nitrogen or in an atmosphere of argon, coating with a substrate of low adhesion and peeling the substrate and the resin mold after curing, or the like.

As an exposure light source to use, preferable are a metal halide lamp, high pressure mercury lamp, chemical lamp, and UV-LED. From the viewpoint of suppressing heating in long exposure, it is preferable to use a filter (including a band-pass filter) for cutting wavelengths longer than visible wavelengths. As the integral of light, at a wavelength of 365 nm, the integral of light is preferably 300 mJ/cm$^2$ or more, is preferably 800 mJ/cm$^2$ or more for the purpose of obtaining a cured material (E) of high reflectance, more preferably ranges from 800 mJ/cm$^2$ to 6,000 mJ/cm$^2$, and particularly preferably ranges from 800 mJ/cm$^2$ to 3,000 mJ/cm$^2$ to prevent resin deterioration by light.

Without depending on the thickness of the cured material, the total light transmittance in 350 nm to 450 nm is preferably 50% or more, and is more preferably 70% or more to perform efficient light reaction. When the thickness of the cured material is in the range of exceeding 0 nm to 50 the total light transmittance in 350 nm to 450 nm is preferably 50% or more, and is more preferably 70% or more.

(Step of Peeling Off the Cured Material from the Mold)

When the master mold have flexibility, it is preferable to peel at least one of the mold surface side or substrate surface side at a certain velocity. As the peeling method, line peeling is preferable. For example, when the material of the master mold is high in rigidity, particularly, in the case of inorganic material, the peeling area is large partially due to surface peeling in peeling from the master mold, and damage of the cured material is concerned. Accordingly, it is preferable to peel from the side of the substrate having flexibility. As the peeling velocity, line peeling at a certain velocity ranging from exceeding 0 m/min. to 5 m/min. in a particular direction is preferable in terms of reductions in damage risk of the cured material.

Further, it is preferable to apply heat treatment during the time between curing and peeling. By applying heat treatment in this process, it is possible to decrease unreacted groups, and mold release is made ease. Furthermore, since the stable state is obtained in a heating environment, durability of the mold is improved in the case of using the obtained resin mold as the mold. The temperature preferably ranges from 50° C. to 120° C., more preferably ranges from 50° C. to 105° C., and further preferably ranges from 60° C. to 105° C. The heating time preferably ranges from 30 seconds to 30 minutes, more preferably ranges from 30 seconds to 15 minutes, and further preferably ranges from 1 minute to 10 minutes.

Meanwhile, heat treatment may be performed after peeling. By performing heat treatment after peeling, besides reaction of unreacted groups being promoted, since it is possible to obtain a stable resin mold at a heating temperature, it is possible to suppress penetration of the resin in transferring from the resin mold to the resin, and to improve mold release. The temperature preferably ranges from 50° C. to 120° C., more preferably ranges from 50° C. to 105° C., and further preferably ranges from 60° C. to 105° C. The heating time preferably ranges from 30 seconds to 30 minutes, more preferably ranges from 30 seconds to 15 minutes, and further preferably ranges from 1 minute to 10 minutes.

(Synthesis by Thermal Polymerization)

The thermoplastic resin having a fine pattern on the surface is manufactured by the method having the steps of thermally crimping the master mold against the thermoplastic resin to form the fine pattern of the master mold on the thermoplastic resin and of removing the master mold from the thermoplastic resin. As well as the method of thermally crimping, it is also possible to prepare by the method of coating by the casting method and then heat-curing.

In the case of thermal crimping, it is preferable to crimp the mold heated to the softening temperature of the thermoplastic resin or more against the transfer layer, or crimp the transfer layer against the mold after heating the transfer layer to the softening temperature of the thermoplastic resin or more. The temperature in thermal crimping more preferably ranges from (the softening temperature of the thermoplastic resin) to (the softening temperature of the thermoplastic resin+60° C.), and particularly preferably ranges from (the softening temperature of the thermoplastic resin+5° C.) to (the softening temperature of the thermoplastic resin+40° C.). In this range, it is possible to efficiently form the fine pattern of the master mold on the transfer layer. Further, the pressure in thermal crimping preferably ranges from 0.5 MPa to 200 MPa (absolute pressure), more preferably ranges from 0.5 MPa to 10 MPa (absolute pressure), and further preferably ranges from 0.5 MPa to 5 MPa.

In the case of removing the mold, it is preferable to remove after cooling the transfer layer to the softening temperature of the thermoplastic resin or less. The range is more preferably from (the softening temperature of the thermoplastic resin−10° C.) to (the softening temperature of the thermoplastic resin−50° C.). In this range, it is possible to maintain the shape of the fine pattern formed on the transfer layer. In addition, the softening temperature of the thermoplastic resin means the glass transition temperature when the thermoplastic resin is amorphous, while meaning the melting temperature when the thermoplastic resin is crystalline.

Examples of the thermoplastic resin are polyethylene, polypropylene, polystyrene, acrylonitrile/styrene-series polymers, acrylonitrile/butadiene/styrene-series polymers, polyvinyl chloride, polyvinylidene chloride, poly(meth)acrylate, polyarylate, polyethylene terephthalate, polybutylene terephthalate, polyamide, polyimide, polyacetal, polycarbonate, polyphenylene ether, polyether ether ketone, polysulfone, polyether sulfone, polyphenylene sulfide, polyvinylidene fluoride, tetrafluoroethylene/perfluoro(alkyl vinyl ether)-series copolymers, tetrafluoroethylene/ethylene-series copolymers, vinylidene fluoride/tetrafluoroethylene/hexafluoropropylene-series copolymers, tetrafluoroethylene/propylene-series copolymers, polyfluoro(meth)acrylate-series polymers, fluorine-containing polymers having fluorine-containing aliphatic cyclic structure in the main chain, polyvinyl fluoride, polytetrafluoroethylene, polychlorotrifluoroethylene, chlorotrifluoroethylene/ethylene-series copolymers, chlorotrifluoroethylene/hydrocarbon-series alkenyl ether-series copolymers, tetrafluoroethyl ene/hexafluoropropylene-series copolymers, and vinylidene fluoride/hexafluoropropylene-series copolymers.

In the case of synthesizing by thermopolymerization, the above-mentioned fluorine-containing (meth)acrylate is used together, and used is a thermopolymerizable mixture containing 0.1 part by weight to 10 parts by weight of fluorine-containing (meth)acrylate relative to 100 parts by weight of (meth)acrylate.

(G) Use

The resin mold according to the invention is used in various manners in nanoimprint uses, and more specifically, is used in manufacturing as optical devices such as a micro lens array, wire grid polarizer, moth-eye type non-reflective film, diffraction grating, and photonic crystal element and nanoimprint uses such as patterned media. Further, it is possible to use the resin mold in manufacturing bio-devices such as a cell culture sheet, fat culture chip, and biosensor battery. Moreover, it is possible to apply to various kinds of batteries, battery of a capacitor, micro/nano channel, radiating surface, heat insulation surface, and the like.

In addition, the resin mold according to the invention enables as many resin molds (A) as possible to be obtained, for example, from the above-mentioned master mold having the fine concavo-convex structure on the surface prepared by electron beam lithography as described above. Further, the resin mold according to the invention enables many resin molds (B) with the fine concavo-convex structure of the resin mold (A) transferred by the nanoimprint method to be obtained as possible. By these means, according to the resin mold according to the invention, it is possible to improve production efficiency drastically.

EXAMPLES

Examples performed to clarify the effect of the invention will be described below.

[Residual Film Thickness Measurement]

The residual film thickness of the fine concavo-convex structure transferred by the nanoimprint method using the resin mold was measured by observation with a scanning electron microscope (hereinafter, SEM). First, a sample was cut into an appropriate size, then torn at room temperature, and was placed on a stage. Next, an observation surface was coated with Os of about 2 nm thickness, and made a sample for microscopic examination. The used apparatus and conditions of microscopic examination are shown below.

Apparatus; HITACHI S-5500
Acceleration voltage; 10 kV
Mode; Normal

[Fluorine Element Concentration Measurement]

The surface fluorine element concentration of the resin mold was measured by X-ray photoelectron spectroscopy (XPS). Since the penetration length of X-ray in the sample surface is several nanometers and is extremely shallow, the measurement value of XPS was adopted as the fluorine element concentration (Es) of the resin mold surface in the invention. The resin mold was cut into small pieces of about 2 mm square, and the piece was covered with a 1 mm×2 mm slot type mask, and was subjected to XPS measurement under following conditions.

XPS Measurement Conditions
Used apparatus; THERMO FISHER ESCALAB 250
Excitation source; mono, Alk$\alpha$ 15 kV×10 mA
Analysis size; about 1 mm (the shape is an ellipse)
Capture region
Survey scan; 0~1, 100 eV
Narrow scan; F 1 s, C 1 s, O 1 s, N 1 s
Pass energy
Survey scan; 100 eV
Narrow scan; 20 eV Meanwhile, to measure the average fluorine element concentration (Eb) in the resin forming the resin mold, a cut piece that was physically peeled was decomposed by a flask combustion method, and was subsequently subjected to ion chromatography analysis, and the average fluorine element concentration (Eb) in the resin was measured.

[Transmittance Measurement]

The transmittance of the resin mold prepared on a PET film was measured using a spectrophotometer (SHIMADZU, UV-2550). The transmittance of the PET film alone was beforehand measured, and using the value as background, the transmittance of the resin mold alone was calculated. In any of resin molds prepared in Examples 1 to 3, the total light transmittance at wavelengths of 350 nm to 450 nm was 50% or more.

The manufacturing methods and physical properties of typical resin molds will be described below.

[Example 1] Manufacturing Method 1 of Fluorine-Containing Resin Mold

Release treatment was applied to a flat-shaped die made of nickel having on the surface a fine concavo-convex structure with a size of fine concavo-convex of 150 nm and a pitch of 145 nm using DURASURF 2101Z made by HARVES Co., Ltd. OPTOOL DAC HP (made by Daikin Industries, Ltd.), trimethylolpropane triacrylate (made by TOAGOSEI Co., Ltd. M350) and IRGACURE 184 (made by Ciba) were mixed in a ratio of 10:100:5 in parts by weight, and the mixture was dropped on the fine concavo-convex structure surface of the die. Subsequently, the mixture liquid was sandwiched using a PET film, and concurrently, was drawn using a hand roller. After UV exposure from the PET film surface side, the die and the PET film were peeled, and the fluorine-containing resin mold was obtained.

The mold was measured by XPS, and the ratio Es/Eb between the fluorine element concentration Es in the surface and the average fluorine element concentration Eb in the resin was 69.

[Example 2] Manufacturing Method 2 of Fluorine-Containing Resin Mold

Release treatment was applied to a cylindrical die made of nickel having on the surface a fine concavo-convex structure with a size of fine concavo-convex of 150 nm and a pitch of 145 nm using DURASURF 2101Z made by HARVES Co., Ltd. OPTOOL DAC HP (made by Daikin Industries, Ltd.), trimethylolpropane triacrylate (made by TOAGOSEI Co., Ltd. M350) and IRGACURE 184 (made by Ciba) were mixed in a ratio of 10:100:5 in parts by weight. Subsequently, the mixture liquid was coated on a PET film using MICRO GRAVURE. Next, a dry step at 60° C. was applied to the PET film, and the film was attached to the fine concavo-convex structure surface of the die made of nickel. After UV exposure, the die and the PET film were peeled, and the fluorine-containing resin mold was obtained.

The resin mold was measured by XPS, and the ratio Es/Eb between the fluorine element concentration Es in the surface and the average fluorine element concentration Eb in the resin was 76.

[Example 3] Manufacturing Method 3 of Fluorine-Containing Resin Mold

Release treatment was applied to a cylindrical die made of nickel having on the surface a fine concavo-convex structure with a size of fine concavo-convex of 150 nm and a pitch of 145 nm using DURASURF 2101Z made by HARVES Co., Ltd. CHEMINOX FAMAC-6 (made by UNIMATEC Co., Ltd.), trimethylolpropane triacrylate (made by TOAGOSEI Co., Ltd. M350) and IRGACURE 184 (made by Ciba) were mixed in a ratio of 2:100:5 in parts by weight. Subsequently, the mixture liquid was coated on a PET film using MICRO GRAVURE. Next, a dry step at 60° C. was applied to the PET film, and the film was attached to the fine concavo-convex structure surface of the die made of nickel. After UV exposure from the PET surface side, the die and the PET film were peeled, and the fluorine-containing resin mold was obtained.

The resin mold was measured by XPS, and the ratio Es/Eb between the fluorine element concentration Es in the surface and the average fluorine element concentration Eb in the resin was 26.

(Repetition Transfer Properties of Fluorine-Containing Resin Mold)

Using the resin compositions prepared in Examples 1 to 3 as a transfer agent, inversion transfer of the resin molds prepared in Examples 1 to 3 was performed. The resin mold was fixed onto a stainless plate, and the transfer agent was dropped on the fine concavo-convex structure surface. Subsequently, the transfer agent was sandwiched using a PET film, and concurrently, was drawn using a hand roller. After UV exposure from the coated PET film surface side, the resin mold and the coated PET film were peeled, and a transfer product A of the resin mold was obtained. In the same procedure, the transfer products A were prepared three times successively from the same resin mold. Certain low peeling resistance (average 10 mN/mm) was exhibited on the three occasions. Further, any rupture of the transfer surfaces was not observed by visual inspection. To check the transfer properties further in detail, cross-section SEM (Scanning Electron Microscope) observation was performed on the resin molds and the transfer products A. It was confirmed that the concavo-convex structure on the resin mold side coincided with the concavo-convex structure of the transfer product A, and that the transfer properties are excellent. From the result, it was confirmed that the transfer products A were the resin molds having the same pattern shape as the master mold.

Next, using the transfer product A as a resin mold, in the same way as the aforementioned transfer method, UV transfer is performed ten times repeatedly on an acrylic UV-curable resin (refractive index 1.52) with a TAC (triacetyl-cellulose resin) film as a substrate, and transfer products B were prepared. There was no rupture of the transfer surfaces by visual inspection, and the products were peeled at resistance of from 5 mN/mm to 10 mN/mm. To check the shapes of the first to tenth transfer products B, evaluations were made by surface reflection spectrum measurement. In surface reflection spectrum measurement, since the fine concavo-convex structure of the surface is reflected in the surface refractive index, when a change occurs in the fine concavo-convex structure, the change is observed as a change in the waveform of reflection spectrum. As a result, the reflection spectrum waveforms of the first to tenth transfer products B coincided with one another, and it was confirmed that any pattern change did not occur by successive repetition transfer. Further, by cross-section SEM observation, the concavo-convex structure on the tenth transfer product B coincided with the concavo-convex structure of the transfer product prepared from the master mold, and therefore, it became evident that the transfer properties in repetition transfer were held.

[Example 4] Preparation of Wire Grid Polarization Film Using the Fluorine-Containing Resin Mold Using the aforementioned transfer product B, a wire grid polarization film was prepared in the following procedure, and optical performance evaluations were made.

(Preparation of Wire Grid Polarization Film)

Formation of Dielectric Layer Using a Sputtering Method

A film of silicon dioxide was formed on the concavo convex-shaped transfer surface as a dielectric layer by a sputtering method. As sputtering apparatus conditions, Ar gas pressure was 0.2 Pa, sputtering power was 770 W/cm$^2$, the coating velocity was 0.1 nm/s, and the film was formed so that the dielectric average thickness on the transfer film was 3 nm. Herein, a glass substrate with a smooth surface was inserted in the apparatus together with the transfer film to measure the thickness of the dielectric, and the dielectric thickness on the smooth glass substrate was defined as the dielectric average thickness.

Deposition of Metal Using a Vacuum Deposition Method

Next, a film of aluminum (Al) was formed on the concavo convex-shaped transfer surface with the film of dielectric layer formed by a vacuum deposition method. As deposition conditions of Al, at room temperature, the degree of vacuum was $2.0 \times 10^{-3}$ Pa, and the deposition velocity was 40 nm/s. A glass substrate with a smooth surface was inserted in the apparatus together with the transfer film to measure the thickness of Al. A deposition angle θ was defined by an angle between the normal of the substrate surface and the deposition source in the plane perpendicularly intersecting the longitudinal direction of the grid. The deposition angle θ was 20° C., and the Al average thickness was 133 nm.

Removal of Unnecessary Al

Next, unnecessary Al was removed by immersing in an alkali aqueous solution. For removal of unnecessary Al, the transfer film with Al deposited was immersed in 0.1 percent by weight aqueous sodium hydroxide for 80 seconds.

Light Transmittance Measurement with a Spectrophotometer

A polarization evaluation apparatus (made by JASCO Corporation, V7000) was used for measurement of the degree of polarization and light transmittance, and measurement was performed on conditions of 23° C. 65% RH. As a result, the degree of polarization was 99.90%, and the light transmittance was 42.5%. As a comparison subject, a wire grid polarization film was prepared using the transfer product UV-transferred from the master mold. The film was prepared by the preparation method in accordance with the above-mentioned procedure. As a result, the degree of polarization was 99.90%, and the light transmittance was 42.0%. In other words, it was confirmed that optical performance of the wire grid polarization films prepared using the master mold or the resin mold as a mold was equal. From the foregoing, it was demonstrated that it is possible to use the resin mold as a mold for wire grid polarization films.

In addition, the degree of polarization and the light transmittance were calculated by the following equation. Imax is parallel Nicol relative to linear polarization, and Imin is the intensity of transmission light in a crossed Nicol state. In addition, the light transmittance T(θ) represents the light transmittance of the incident light angle θ.

The degree of polarization=[(*I*max−*I*min)/(*I*max+*I*min)]×100%

[Example 5] Nanoimprint Using the Fluorine-Containing Resin Mold

A cation polymerizable resin containing 3-ethyl-3-{[(3-ethyloxetane-3-yl)methoxy]methyl} oxetane and 3,4-epoxycyclohexylmethyl-3',4'-epoxycyclohexane carboxylate was coated on a PET film with SiO$_2$ deposited using Micro Gravure. Subsequently, the PET film was attached to the fluorine-containing resin mold prepared in each of Example 1, Example 2 and Example 3, pressure was concurrently applied by rubber nip, and UV exposure was performed from the resin mold side with the nip pressure disappeared. After UV exposure, the mold and the PET film were peeled. The transferred fine concavo-convex structure was observed by SEM, and the residual film thickness was 5 nm or less.

Comparative Example 1

As Comparative Example 1, a composition without containing a fluorine resin composition was prepared in the composition of Example 1, and a resin mold was prepared. As a result, it was not possible to peel from the interface with the transfer agent cured material after UV cure.

Comparative Example 2

Release treatment was applied to a flat-shaped die made of nickel having on the surface a fine concavo-convex structure with a size of fine concavo-convex of 150 nm and a pitch of 145 nm using DURASURF 2101Z made by HARVES Co., Ltd. PAC01 made by Toyo Gosei CO. Ltd. was dropped on the fine concavo-convex structure surface of the die. Subsequently, the UV-curable resin was sandwiched using a PET film, and concurrently, was drawn using a hand roller. After UV exposure from the PET film surface side, the die and the PET film were peeled, and a resin mold was obtained.

A cation polymerizable resin containing 3-ethyl-3-{[(3-ethyloxetane-3-yl)methoxy]methyl} oxetane and 3,4-Epoxycyclohexylmethyl-3',4'-epoxycyclohexane carboxylate was coated on a PET film with SiO$_2$ deposited using MICRO GRAVURE. Subsequently, the PET film was attached to the resin mold, pressure was concurrently applied by rubber nip, and UV exposure was performed from the resin mold side with the nip pressure disappeared. After UV exposure, attempts were made to peel the mold and the PET film, but the mold and the PET film highly adhered and were not peeled. Meanwhile, the partially peeled portion was observed by AFM, and there was not transfer of the fine concavo-convex structure.

Example 6

Cylindrical Die Preparation

Quartz glass was used as a substrate of a cylindrical die. A fine concavo-convex structure was formed on the quartz glass surface by direct-write lithography using a semiconductor laser. DURASURF HD-1101Z (made by Daikin Industries, Ltd.) was coated on the quartz glass roll surface with the fine concavo-convex structure formed, heated at 60° C. for 1 hour, and then, allowed to stand at room temperature for 24 hours to fix. Then, cleaning was performed three times using DURASURF HD-ZV (made by Daikin Industries, Ltd.), and release treatment was performed.

Preparation of Resin Mold (A)

Raw materials corresponding to the sample numbers shown in following Table 1 were mixed, and photo-curable resins were prepared. As the fluorine-containing (meth) acrylate, OPTOOL DAC HP (made by Daikin Industries, Ltd.) was used in sample Nos. D1 to D7, D'4 and D'5 in following Table 1. Further, in sample No. F1, CHEMINOX FAMAC-6 (made by UNIMATEC Co., Ltd.) was used. Sample No. KK was synthesized as described below. Mixed were 45 parts by weight of trifluoroethyl methacrylate, 45 parts by weight of perfluorooctyl ethyl acrylate, 10 parts by weight of glycidyl methacrylate, 0.5 part by weight of dodecyl mercaptan, 1.5 part by weight of 2-2'-azobis(2-methylbutyronitrile) and 200 parts by weight of methyl ethyl ketone, the mixture was stirred at 80° C. for 7 hours in an atmosphere of nitrogen, and a prepolymer diluted with the methyl ethyl ketone solution was obtained. Next, mixed were 26 parts by weight of methyl ethyl ketone solution of the prepolymer, 4 parts by weight of FLUORITE FE-16, and 0.2 part by weight of San-Aid SI-100L (trade name made by Sanshin Chemical Industry Co., Ltd.), the mixture was diluted with methyl ethyl ketone so that the solid content was 10%, and sample No. KK was obtained.

Using sample Nos. D1 to D7, F1 and KK as a photosensitive resin mixture, resin molds (A) were obtained by the following operation. The mixture was coated on an easy adhesion surface of a PET film: A4100 (made by Toyobo Co., Ltd.: width 300 mm, thickness 100 μm) by MICRO GRAVURE COATING (made by Yasui Seiki Co., Ltd.) so that the coating film thickness was 6 μm. Next, the PET film with the photo-curable resin coated was pressed against the above-mentioned cylindrical die with a nip roll (0.1 MPa), and was irradiated with ultraviolet rays at a temperature of 25° C. and moisture of 60% under atmospheric pressure using a UV exposure apparatus (Fusion UV Systems Japan Co., Ltd., H bulb) so that the integral amount of exposure below the center of the lamp was 600 mJ/cm$^2$, photo-curing was performed successively, and obtained was a reel-shaped resin mold (A) (length 200 m, width 300 mm) with the fine concavo-convex structure transferred to the surface. The surface fine concavo-convex shape of the reel-shaped resin mold (A) was checked by scanning electron microscope observation. As a result, the adjacent distance between convex portions was 250 nm, and the height of the convex portion was 250 nm. Sample Nos. D5' and D4' were transferred in the same technique as described above except that the cylindrical die without undergoing release treatment was used.

Preparation of Resin Mold (B)

Using the obtained reel-shaped resin mold (A) corresponding to each sample number as a mold, transfer was performed as described below using the resin used in preparation of the reel-shaped resin mold (A) as a transfer material, and a reel-shaped resin mold (B) was obtained. Using a PET film: A4100 (made by Toyobo Co., Ltd.: width 300 mm, thickness 100 μm), the resin was coated on an easy adhesion surface of the PET film by MICRO GRAVURE COATING (made by Yasui Seiki Co., Ltd.) so that the coating film thickness was 6 Next, the PET film with the photo-curable resin coated was pressed against the fine concavo-convex structure surface of the above-mentioned resin mold (A) with the nip roll (0.1 MPa), and was irradiated with ultraviolet rays at a temperature of 25° C. and moisture of 60% under atmospheric pressure using the UV exposure apparatus (Fusion UV Systems Japan Co., Ltd., H bulb) so that the integral amount of exposure below the center of the lamp was 600 mJ/cm$^2$, photo-curing was performed successively, and obtained was a reel-shaped resin mold (B) (length 200 m, width 300 mm) with the fine concavo-convex structure transferred to the surface.

Preparation of the resin mold (B) from the resin mold (A) was also performed by a batch process as described below. The reel-shaped resin mold (A) was cut into a 15-cm square, a photo-curable resin was dropped on the resin mold (A), and the resin mold (A) was attached to an easy adhesion surface of a PET film: A4100, was concurrently drawn with a hand roller, and subsequently, was irradiated with UV light. Next, the resultant was heated in an over at 105° C. for 3 minutes, then the resin mold (A) was peeled, and the resin mold (B) was obtained. This operation was repeated 20 times, and attempts were made to obtain 20 sheets of the resin mold (B) using the same resin mold (A).

Preparation of Resin Molds (C) (D)

Preparation of the resin mold (C) from the obtained reel-shaped resin mold (B) was also performed by a batch process as described below. The reel-shaped resin mold (B) was cut into a 15-cm square, a photo-curable resin was dropped on the resin mold (B), and the resin mold (B) was attached to an easy adhesion surface of a PET film: A4100, was concurrently drawn with a hand roller, and subsequently, was irradiated with UV light. Next, the resultant was heated in the over at 105° C. for 3 minutes, then the resin mold (B) was peeled, and the resin mold (C) was obtained.

Next, the resin mold (C) was cut into a 12-cm square, a photo-curable resin was dropped on the resin mold (C), the resin mold (C) was attached to an easy adhesion surface of a PET film: A4100, was concurrently drawn with a hand roller, and subsequently, was irradiated with UV light. Next, the resultant was heated in the oven at 105° C. for 3 minutes, then the resin mold (C) was peeled, and the resin mold (D) was obtained. All of the operation was performed using the same resin as the resin forming the resin mold.

Transfer to Another Resin

Using the obtained reel-shaped resin mold (B) as a mold, transfer was performed as described below using resins as described below as a transfer material, and reel-shaped resin forming bodies were obtained.

Resin SH710 (made by Dow Corning Toray Co., Ltd.), KBM5103 (made by Shin-Etsu Chemical Co., Ltd.), titanium tetrabutoxide (made by Wako Pure Chemical Industries Co., Ltd.), IRGACURE 184 (made by Ciba) and IRGACURE 369 (made by Ciba) were mixed in a ratio of 1:2:2:0.068:0.032 in parts by weight.

Using a PET film: A4100 (made by Toyobo Co., Ltd.: width 300 mm, thickness 100 μm), the resin was coated on an easy adhesion surface of the PET film by MICRO GRAVURE COATING (made by Yasui Seiki Co., Ltd.) so that the coating film thickness was 6 μm. Next, the PET film with a photo-curable inorganic resist coated was pressed against the above-mentioned cylindrical die with the nip roll (0.1 MPa), and was irradiated with ultraviolet rays at a temperature of 25° C. and moisture of 60% under atmospheric pressure using the UV exposure apparatus (Fusion UV Systems Japan Co., Ltd., H bulb) so that the integral amount of exposure below the center of the lamp was 600 mJ/cm$^2$, photo-curing was performed successively, the resultant was heated at 105° C., the resin mold (B) was then peeled, and obtained was a reel (length 200 m, width 300 mm) with the fine concavo-convex structure comprised of the inorganic material transferred to the surface. The surface fine concavo-convex shape of the reel was checked by scanning electron microscope observation. As a result, the adjacent distance between convex portions was 250 nm, and the height of the convex portion was 250 nm.

Each Transfer Result and Es/Eb

The above-mentioned transfer results and Es/Eb values of the reel-shaped resin molds (A) are shown in Table 1 as described below. Each abbreviation in Table 1 as described below indicates the following means.

OPTOOL DAC HP (made by Daikin Industries, Ltd.) or FAMAC6 . . . fluorine-containing (meth)acrylate containing a solvent Fluorine-non-containing (meth)acrylate . . . trimethylolpropane triacrylate (made by TOAGOSEI Co., Ltd. M350)

Fluorine-containing (meth)acrylate . . . parts by weight of fluorine-containing (meth)acrylate without the solvent relative to 100 parts by weight of fluorine-non-containing (meth)acrylate (M350, glycidyl methacrylate)

Es/Eb . . . As Es, the measurement value by the XPS method as described previously was used. Eb was calculated from the charge amount.

Release property evaluation 1 . . . Transfer result when release treatment was not applied to the cylindrical mold (die) in preparation of resin mold (A). x represents the case where the pattern was not formed. Δ represents the case where transfer was made but the pattern was ruptured partially. ○ represents the case where the transfer result was excellent.

Release property evaluation 2 . . . Transfer result when preparation of the resin mold (B) from the resin mold (A) was performed by the batch process. The number of times of an examination is 20 sheets. x represents the case where the resin mold (A) and the resin mold (B) adhered and were not peeled. Δ represents the case where peeling was not made partially. ○ represents the case where peeling was made but the pattern was ruptured partially. ⊚ represents the case where all 20 sheets were excellent in transfer properties.

Release property evaluation 3 . . . Transfer result when preparation of the resin molds (C) and (D) was performed from the resin mold (A). x represents the case where peeling was not made at all during the process of preparation of the resin mold (C) or the resin mold (D). Δ represents the case where preparation was made up to the resin mold (D) but peeling was not made partially. ○ represents the case where preparation was made up to the resin mold (D) but the pattern was ruptured partially. ⊚ represents the case where transfer was made up to the resin mold (D) with excellence.

Release property evaluation 4 . . . Transfer result when transfer was made to another resin using the resin mold (B) prepared from the resin mold (A). x represents the case where the resins adhered and were not peeled. Δ represents the case where peeling was not made partially. ○ represents the case where the pattern was ruptured partially. ⊚ represents the case where transfer was excellent.

perform transfer of 20 sheets by the batch process from the prepared resin mold (A) (sample Nos. D1 to D7, F1, D5' and D4').

Particularly, in the case of 20≤Es/Eb≤200, since free energy effectively reduces on the resin surface, while being kept high near the substrate in the resin, release properties and durability of the resin mold (A) itself were excellent, and in the case of the range of 26≤Es/Eb≤189, transfer was made with excellence in preparation of resin molds (C) and (D) from the resin mold (A) (sample Nos. D2 to D7 and F1). Further, in the case of the range of 31≤Es/Eb≤155, the most excellent transfer results were obtained (sample Nos. D3 to D7).

INDUSTRIAL APPLICABILITY

It is possible to use the resin mold of the invention suitably in the nanoimprint field.

The present application is based on Japanese Patent Application No. 2010-053194 filed on Mar. 10, 2010, entire content of which is expressly incorporated by reference herein.

The invention claimed is:

1. A method of manufacturing a resin mold containing a substrate and a cured material deposited on said substrate and having a fine concavo-convex structure on a surface of the cured material, comprising:

coating said substrate or a master mold with a photopolymerizable mixture containing fluorine-non-containing (meth)acrylate, fluorine-containing (meth)acrylate, and a photoinitiator, migrating or diffusing the fluorine-containing (meth) acrylate to the surface of the photopolymerizable mixture coated on said substrate or the master mold by performing pre-baking after coating the substrate with the resin composition;

pressing the photopolymerizable mixture between said substrate and the master mold;

obtaining the cured material by curing the photopolymerizable mixture by exposure;

applying pre-peeling heating treatment to the cured material during the time between curing and peeling;

TABLE 1

| Photopolymerizable mixture (parts by weight) | | D1 | D2 | D3 | D4 | D5 | D6 | D7 | F1 | D5' | D4' | KK |
|---|---|---|---|---|---|---|---|---|---|---|---|---|
| OPTOOL DAC HP | | 2.0 | 4.0 | 5.0 | 10.0 | 17.5 | 20.0 | 30.0 | — | 17.5 | 10.0 | — |
| FAMAC 6 (parts by weight) | | — | — | — | — | — | — | — | 2.0 | — | — | — |
| Fluorine-non-containing (meth) acrylate (parts by weight) | | 100 | 100 | 100 | 100 | 100 | 100 | 100 | 100 | 100 | 100 | — |
| Photoinitiator (parts by weight) | Irgacure 184 | 5.0 | 5.0 | 5.0 | 5.0 | 5.5 | 5.5 | 5.5 | 5.0 | 5.5 | 5.5 | — |
| | Irgacure 369 | — | — | — | — | 2.0 | 2.0 | 2.0 | — | 2.0 | 2.0 | — |
| Flourine-containing (meth) acrylate (parts by weight) | | 0.4 | 0.8 | 1.0 | 2.0 | 3.4 | 4.0 | 6.0 | 2.0 | 3.4 | 2.0 | 900 |
| Es/Eb | | 376 | 189 | 155 | 80 | 48 | 46 | 31 | 26 | 9 | 2 | 1 |
| Release property evaluation 1 | | Δ | ○ | ○ | ○ | ○ | ○ | ○ | ○ | ○ | ○ | Δ |
| Release property evaluation 2 | | ○ | ○ | ⊚ | ⊚ | ⊚ | ⊚ | ⊚ | ○ | Δ | Δ | X |
| Release property evaluation 3 | | X | ○ | ⊚ | ⊚ | ⊚ | ⊚ | ⊚ | ○ | Δ | Δ | X |
| Release property evaluation 4 | | X | ○ | ⊚ | ⊚ | ⊚ | ⊚ | ⊚ | ○ | Δ | X | X |

As can be seen from Table 1, when the fluorine element concentration (Es) of the resin mold surface portion was larger than the average fluorine concentration (Eb) in the resin forming the resin mold, even in the case where release treatment was not applied to the cylindrical mold (die), it was possible to perform pattern transfer, and the resin molds (A) were formed (sample No. D1 to D7, F1, D5', D4' and KK). Further, in the case of 2≤Es/Eb≤376, it was possible to peeling off the cured material with said substrate from the master mold at a certain velocity to obtain the resin mold; and performing post-peeling heat treatment to the resin mold after peeling, wherein the fluorine element concentration (Es) in a resin mold surface portion is more than an average fluorine element concentration (Eb) in the resin mold, wherein said resin mold surface portion means a portion in the range of 2 nm to 20 nm in the thickness direction perpendicular to the surface of the resin mold, and
a ratio between Eb and Es satisfies equation (1):

$$30 \leq Es/Eb \leq 160. \qquad \text{Eq.(1)}$$

2. A method of manufacturing an (n)th generation resin mold, in which n is more than two, containing a substrate and a cured material deposited on said substrate and having a fine concavo-convex structure on a surface of the cured material, comprising:
coating said substrate or an (n−1)th generation resin mold with a photopolymerizable mixture containing fluorine-non-containing (meth)acrylate, fluorine-containing (meth)acrylate, and a photoinitiator,
migrating or diffusing the fluorine-containing (meth) acrylate to the surface of the photopolymerizable mixture coated on said substrate or the (n−1)th generation resin mold;
pressing the photopolymerizable mixture between said substrate and the (n−1)th generation resin mold by performing pre-baking after coating the substrate with the resin composition;
obtaining the cured material by curing the photopolymerizable mixture by exposure;
applying pre-peeling heating treatment to the cured material during the time between curing and peeling;
peeling off the cured material with the (n−1)th generation resin mold from the (n−1)th generation resin at a certain velocity to obtain the resin mold, wherein the fluorine element concentration (Es) in a resin mold surface portion is more than an average fluorine element concentration (Eb) in the resin mold; and
performing post-peeling heat treatment to the resin mold after peeling, wherein
said resin mold surface portion means a portion in the range of 2 nm to 20 nm in the thickness direction perpendicular to the surface of the (n)th generation resin mold, and
a ratio between Eb and Es satisfies equation (1):

$$30 \leq Es/Eb \leq 160. \qquad \text{Eq.(1)}$$

3. The method according to claim 1, wherein temperature of the pre-baking ranges from 50° C. to 105° C. and its time ranges from 1 minute to 15 minutes.

4. The method according to claim 3, temperature of the pre-peeling heating treatment ranges from 50° C. to 105° C. and its heating time ranges from 30 seconds to 15 minutes.

5. The method according to claim 4, temperature of the post-peeling heating treatment ranges from 50° C. to 105° C. and its heating time ranges from 30 seconds to 15 minutes.

6. A method of manufacturing another resin mold containing another substrate and another cured material deposited on said another substrate by using the resin mold manufactured by the method according to claim 5, comprising:
coating said another substrate or the resin mold with the photopolymerizable mixture;
migrating or diffusing the fluorine-containing (meth) acrylate to the surface of the photopolymerizable mixture coated on said another substrate or the resin mold;
pressing the photopolymerizable mixture between said another substrate and the resin mold;
obtaining said another cured material by curing the photopolymerizable mixture by exposure; and
peeling off said another cured material with said another substrate from the resin mold to obtain said another resin mold.

7. A method of manufacturing a transfer material containing another substrate and another cured material deposited on said another substrate by using the resin mold manufactured by the method according to claim 5, comprising:
coating said another substrate or the resin mold with the photopolymerizable mixture;
migrating or diffusing the fluorine-containing (meth) acrylate to the surface of the photopolymerizable mixture coated on said another substrate or the resin mold;
pressing the photopolymerizable mixture between said another substrate and the resin mold;
obtaining said another cured material by curing the photopolymerizable mixture by exposure; and
peeling off said another cured material with said another substrate from the resin mold to obtain the transfer material.

8. The method according to any one of claims 5-7, wherein the photopolymerizable mixture containing 100 parts by weight of the fluorine-non-containing (meth)acrylate and 0.8 part by weight to 6 parts by weight of the fluorine-containing (meth)acrylate.

9. The method according to any one of claims 5-7, wherein the fluorine-containing (meta)acrylate is expressed by following chemical formula (1);

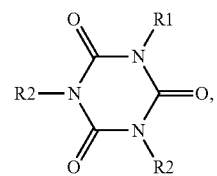

Chemical formula (1)

where R1 represents following chemical formula (2), and R2 represents following chemical formula (3),

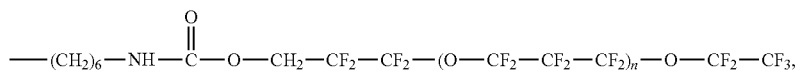

Chemical formula (2)

where n is an integer of from 1 to 6,

Chemical formula (3)

where R is H or $CH_3$.

10. The method according to claim 9, wherein the photopolymerizable mixture containing 100 parts by weight of the fluorine-non-containing (meth)acrylate and 0.8 part by weight to 6 parts by weight of the fluorine-containing (meth)acrylate.

11. The method according to claim 2, wherein temperature of the pre-baking ranges from 50° C. to 105° C. and its time ranges from 1 minute to 15 minutes.

12. The method according to claim 11, temperature of the pre-peeling heating treatment ranges from 50° C. to 105° C. and its time ranges from 30 seconds to 15 minutes.

13. The method according to claim 12, temperature of the post-peeling heating treatment ranges from 50° C. to 105° C. and its heating time ranges from 30 seconds to 15 minutes.

14. A method of manufacturing a transfer material containing another substrate and another cured material deposited on said another substrate by using the (n)th generation resin mold manufactured by the method according to claim 13, comprising:
coating said another substrate or the (n)th generation resin with the photopolymerizable mixture;
migrating or diffusing the fluorine-containing (meth)acrylate to the surface of the photopolymerizable mixture coated on said another substrate or the (n)th generation resin mold;
pressing the photopolymerizable mixture between said another substrate and the resin mold;
obtaining said another cured material by curing the photopolymerizable mixture by exposure; and
peeling off said another cured material with said another substrate from the (n)th generation resin mold to obtain the transfer material.

15. The method according to claim 13 or 14, wherein the photopolymerizable mixture containing 100 parts by weight of the fluorine-non-containing (meth)acrylate and 0.8 part by weight to 6 parts by weight of the fluorine-containing (meth)acrylate.

16. The method according to claim 13 or 14, wherein the fluorine-containing (meta)acrylate is expressed by following chemical formula (1);

Chemical formula (1)

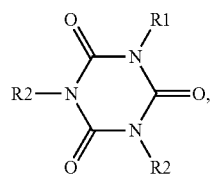

where R1 represents following chemical formula (2), and R2 represents following chemical formula (3), Chemical formula (2)

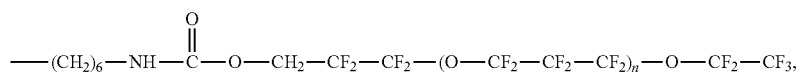

where n is an integer of from 1 to 6,

Chemical formula (3)

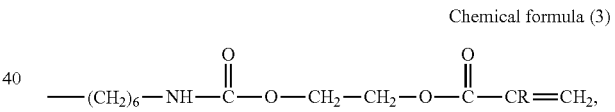

where R is H or CH$_3$.

17. The method according to claim 16, wherein the photopolymerizable mixture containing 100 parts by weight of the fluorine-non-containing (meth)acrylate and 0.8 part by weight to 6 parts by weight of the fluorine-containing (meth)acrylate.

18. The method according to claim 1 or 2, wherein the certain velocity is more than 0 m/min. and not greater than 5 m/min.

* * * * *